(12) United States Patent
Kuo et al.

(10) Patent No.: US 8,535,961 B1
(45) Date of Patent: Sep. 17, 2013

(54) LIGHT EMITTING DIODE (LED) PACKAGE AND METHOD

(75) Inventors: Bob Shih-Wei Kuo, Chandler, AZ (US); Brett Arnold Dunlap, Queen Creek, AZ (US); David Bolognia, Scottsdale, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 280 days.

(21) Appl. No.: 12/964,397

(22) Filed: Dec. 9, 2010

(51) Int. Cl.
*H01L 21/00* (2006.01)

(52) U.S. Cl.
USPC .................. 438/28; 257/88; 257/E33.059

(58) Field of Classification Search
USPC ................... 438/28; 257/88, E33.059
See application file for complete search history.

(56) References Cited

U.S. PATENT DOCUMENTS

| | | | |
|---|---|---|---|
| 3,868,724 A | 2/1975 | Perrino | |
| 3,916,434 A | 10/1975 | Garboushian | |
| 4,322,778 A | 3/1982 | Barbour et al. | |
| 4,532,419 A | 7/1985 | Takeda | |
| 4,642,160 A | 2/1987 | Burgess | |
| 4,645,552 A | 2/1987 | Vitriol et al. | |
| 4,685,033 A | 8/1987 | Inoue | |
| 4,706,167 A | 11/1987 | Sullivan | |
| 4,716,049 A | 12/1987 | Patraw | |
| 4,786,952 A | 11/1988 | MacIver et al. | |
| 4,806,188 A | 2/1989 | Rellick | |
| 4,811,082 A | 3/1989 | Jacobs et al. | |
| 4,897,338 A | 1/1990 | Spicciati et al. | |
| 4,905,124 A | 2/1990 | Banjo et al. | |
| 4,964,212 A | 10/1990 | Deroux-Dauphin et al. | |
| 4,974,120 A | 11/1990 | Kodai et al. | |
| 4,996,391 A | 2/1991 | Schmidt | |
| 5,021,047 A | 6/1991 | Movern | |
| 5,072,075 A | 12/1991 | Lee et al. | |
| 5,072,520 A | 12/1991 | Nelson | |

(Continued)

FOREIGN PATENT DOCUMENTS

| | | |
|---|---|---|
| JP | 05-109975 | 4/1993 |
| JP | 05-136323 | 6/1993 |

(Continued)

OTHER PUBLICATIONS

IBM Technical Disclosure Bulletin, "Microstructure Solder Mask by Means of a Laser", vol. 36, Issue 11, p. 589, Nov. 1, 1993. (NN9311589).

(Continued)

*Primary Examiner* — Julio J Maldonado
*Assistant Examiner* — Sonya D McCall Shepard
(74) *Attorney, Agent, or Firm* — McKay and Hodgson, LLP; Serge J. Hodgson

(57) ABSTRACT

A method of forming a light emitting diode (LED) package includes mounting a LED structure to a carrier, overmolding the LED structure in a package body, backgrinding the package body to expose the LED structure, removing the carrier, and forming a redistribution layer (RDL) buildup structure comprising a RDL circuit pattern coupled to a LED of the LED structure. The LED package is formed without a substrate in one embodiment. By forming the LED package without a substrate, the thickness of the LED package is minimized. Further, by forming the LED package without a substrate, heat removal from the LED is maximized as is electrical performance. Further still, by forming the LED package without a substrate, the fabrication cost of the LED package is minimized.

19 Claims, 30 Drawing Sheets

(56) References Cited

U.S. PATENT DOCUMENTS

| | | |
|---|---|---|
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Djennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,726,493 A | 3/1998 | Yamashita et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,847,453 A | 12/1998 | Uematsu et al. |
| 5,883,425 A | 3/1999 | Kobayashi |
| 5,894,108 A | 4/1999 | Mostafazadeh et al. |
| 5,898,219 A | 4/1999 | Barrow |
| 5,903,052 A | 5/1999 | Chen et al. |
| 5,907,477 A | 5/1999 | Tuttle et al. |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,622 A | 3/2000 | Wallace |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Panchou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,316,285 B1 | 11/2001 | Jiang et al. |
| 6,351,031 B1 | 2/2002 | Iijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,448,510 B1 | 9/2002 | Neftin et al. |
| 6,451,509 B2 | 9/2002 | Keesler et al. |
| 6,479,762 B2 | 11/2002 | Kusaka |
| 6,489,676 B2 | 12/2002 | Taniguchi et al. |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,638 B2 | 4/2003 | Fischer et al. |
| 6,586,682 B2 | 7/2003 | Strandberg |
| 6,608,757 B1 | 8/2003 | Bhatt et al. |
| 6,660,559 B1 | 12/2003 | Huemoeller et al. |
| 6,715,204 B1 | 4/2004 | Tsukada et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,838,776 B2 | 1/2005 | Leal et al. |
| 6,888,240 B2 | 5/2005 | Towle et al. |
| 6,905,914 B1 * | 6/2005 | Huemoeller et al. ......... 438/118 |
| 6,919,514 B2 | 7/2005 | Konrad et al. |
| 6,921,968 B2 | 7/2005 | Chung |
| 6,921,975 B2 | 7/2005 | Leal et al. |
| 6,931,726 B2 | 8/2005 | Boyko et al. |
| 6,946,325 B2 | 9/2005 | Yean et al. |
| 6,953,995 B2 | 10/2005 | Farnworth et al. |
| 6,963,141 B2 | 11/2005 | Lee et al. |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,087,514 B2 | 8/2006 | Shizuno |
| 7,125,744 B2 | 10/2006 | Takehara et al. |
| 7,185,426 B1 | 3/2007 | Hiner et al. |
| 7,189,593 B2 | 3/2007 | Lee |
| 7,198,980 B2 | 4/2007 | Jiang et al. |
| 7,242,081 B1 | 7/2007 | Lee |
| 7,282,394 B2 | 10/2007 | Cho et al. |
| 7,285,855 B2 | 10/2007 | Foong |
| 7,345,361 B2 | 3/2008 | Mallik et al. |
| 7,372,151 B1 | 5/2008 | Fan et al. |
| 7,420,809 B2 | 9/2008 | Lim et al. |
| 7,429,786 B2 | 9/2008 | Karnezos et al. |
| 7,459,202 B2 | 12/2008 | Magera et al. |
| 7,548,430 B1 | 6/2009 | Huemoeller et al. |
| 7,550,857 B1 | 6/2009 | Longo et al. |
| 7,633,765 B1 | 12/2009 | Scanlan et al. |
| 7,671,457 B1 | 3/2010 | Hiner et al. |
| 7,777,351 B1 | 8/2010 | Berry et al. |
| 7,825,520 B1 | 11/2010 | Longo et al. |
| 2002/0017712 A1 | 2/2002 | Bessho et al. |
| 2002/0061642 A1 | 5/2002 | Haji et al. |
| 2002/0066952 A1 | 6/2002 | Taniguchi et al. |
| 2002/0195697 A1 | 12/2002 | Mess et al. |
| 2003/0025199 A1 | 2/2003 | Wu et al. |
| 2003/0128096 A1 | 7/2003 | Mazzochette |
| 2003/0134450 A1 | 7/2003 | Lee |
| 2003/0141582 A1 | 7/2003 | Yang et al. |
| 2003/0197284 A1 | 10/2003 | Khiang et al. |
| 2004/0063246 A1 | 4/2004 | Karnezos |
| 2004/0145044 A1 | 7/2004 | Sugaya et al. |
| 2004/0159462 A1 | 8/2004 | Chung |
| 2005/0046002 A1 | 3/2005 | Lee et al. |

| | | | |
|---|---|---|---|
| 2005/0139985 A1 | 6/2005 | Takahashi | |
| 2005/0242425 A1 | 11/2005 | Leal et al. | |
| 2006/0008944 A1 | 1/2006 | Shizuno | |
| 2006/0270108 A1 | 11/2006 | Farnworth et al. | |
| 2007/0273049 A1 | 11/2007 | Khan et al. | |
| 2007/0281471 A1 | 12/2007 | Hurwitz et al. | |
| 2007/0290376 A1 | 12/2007 | Zhao et al. | |
| 2008/0230887 A1 | 9/2008 | Sun et al. | |
| 2012/0056219 A1* | 3/2012 | Basceri et al. | 257/93 |

FOREIGN PATENT DOCUMENTS

| | | |
|---|---|---|
| JP | 07-017175 | 1/1995 |
| JP | 08-190615 | 7/1996 |
| JP | 10-334205 | 12/1998 |

OTHER PUBLICATIONS

Kim et al., "Application of Through Mold Via (TMV) as PoP base package", 58th ECTC Proceedings, May 2008, Lake Buena Vista, FL, 6 pages, IEEE.

Scanlan, "Package-on-package (PoP) with Through-mold Vias", Advanced Packaging, Jan. 2008, 3 pages, vol. 17, Issue 1, PennWell Corporation.

Hiner et al., "Printed Wiring Motherboard Having Bonded Interconnect Redistribution Mesa", U.S. Appl. No. 10/992,371, filed Nov. 18, 2004.

Huemoeller et al., "Build Up Motherboard Fabrication Method and Structure", U.S. Appl. No. 11/824,395, filed Jun. 29, 2007.

Huemoeller et al., "Thin Substrate Fabrication Method and Structure", U.S. Appl. No. 11/953,680, filed Dec. 10, 2007.

Huemoeller et al., "Buildup Dielectric Layer Having Metallization Pattern Semiconductor Package Fabrication Method", U.S. Appl. No. 12/387,691, filed May 5, 2009.

Miller Jr. et al., "Thermal Via Heat Spreader Package and Method", U.S. Appl. No. 12/421,118, filed Apr. 9, 2009.

Scanlan et al., "Semiconductor Package Including a Top-Surface Metal Layer for Implementing Circuit Features", U.S. Appl. No. 12/589,839, filed Oct. 28, 2009.

Hiner et al., "Semiconductor Package Including Top-Surface Terminals for Mounting Another Semiconductor Package", U.S. Appl. No. 12/655,724, filed Jan. 5, 2010.

Hiner et al., "Semiconductor Package Including Top-Surface Terminals for Mounting Another Semiconductor Package", U.S. Appl. No. 12/802,661, filed Jun. 10, 2010.

Scanlan et al., "Semiconductor Package Including a Top-Surface Metal Layer for Implementing Circuit Features", U.S. Appl. No. 12/802,715, filed Jun. 10, 2010.

Scanlan, "Stacked Redistribution Layer (RDL) Die Assembly Package", U.S. Appl. No. 12/924,493, filed Sep. 27, 2010.

* cited by examiner

Single LED package formation method 100

Multiple LED package formation method 900

Multiple LED package formation method 1600

Multiple LED package formation method 2200

LIGHT EMITTING DIODE (LED) PACKAGE AND METHOD

TECHNICAL FIELD

The present application relates to the field of electronics, and more particularly, to electronic component structures and the related methods.

BACKGROUND

To form a light emitting diode (LED) package, a LED is mounted to a substrate. The LED is encapsulated and a lens is attached.

However, the substrate is relatively thick thus increasing the size of the LED package. Further, the substrate impedes heat removal from the LED. In addition, the substrate is relatively expensive.

BRIEF DESCRIPTION OF THE DRAWINGS

In the following description, the same or similar elements are labeled with the same or similar reference numbers.

DETAILED DESCRIPTION

Figure 2:
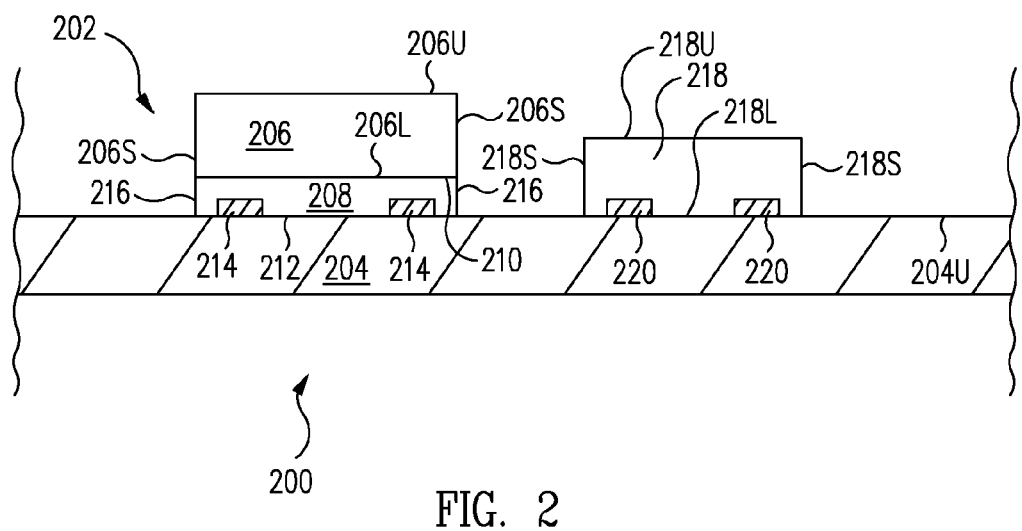
FIG. 2 is a cross-sectional view of a LED package during fabrication in accordance with one embodiment.
Figure 3:
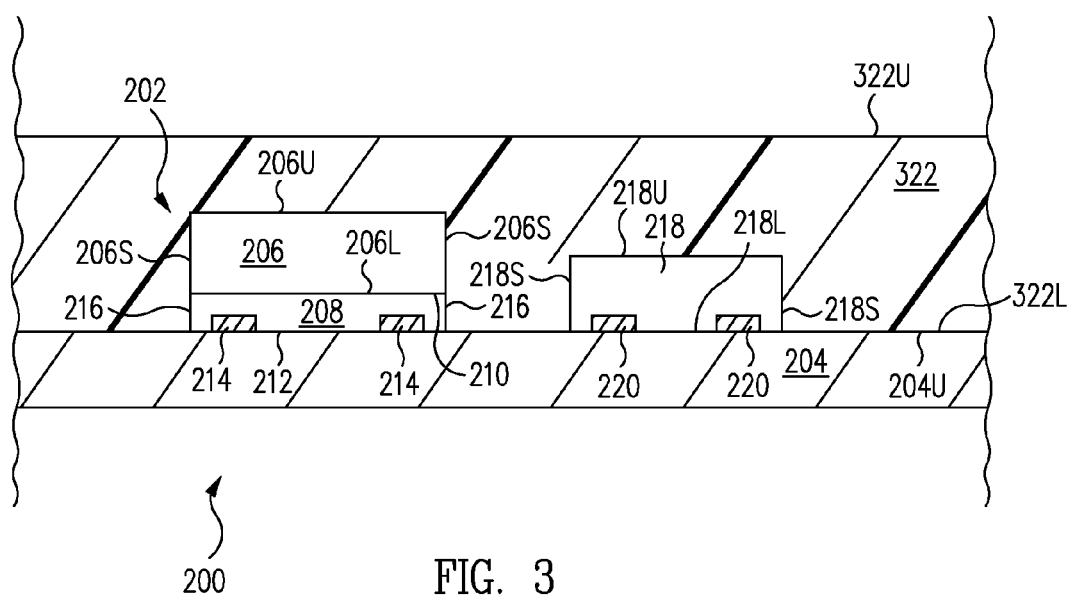
FIGS. 3, 4, 5, 6, 7, 8 are cross-sectional views of the LED package of FIG. 2 at further stages during fabrication in accordance with various embodiments.
Figure 4:
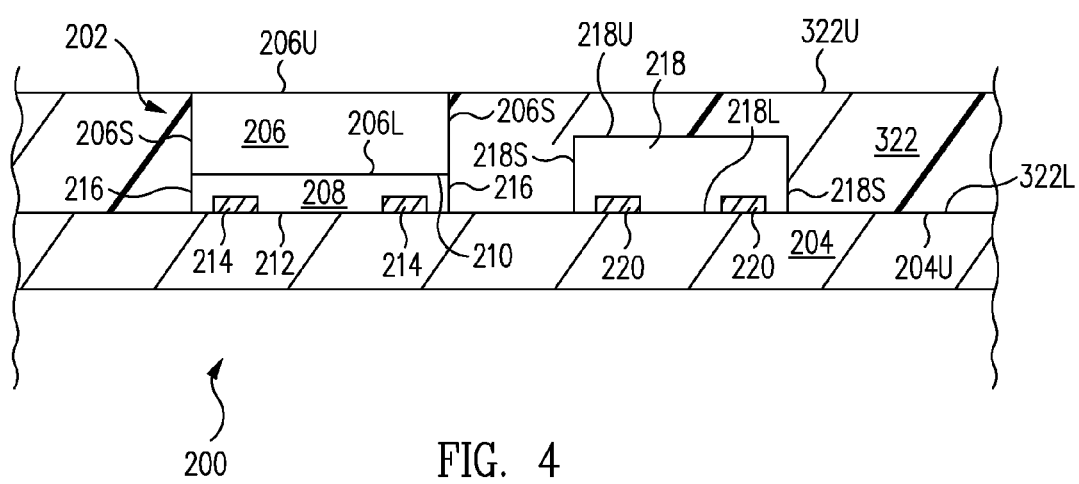
Figure 5:
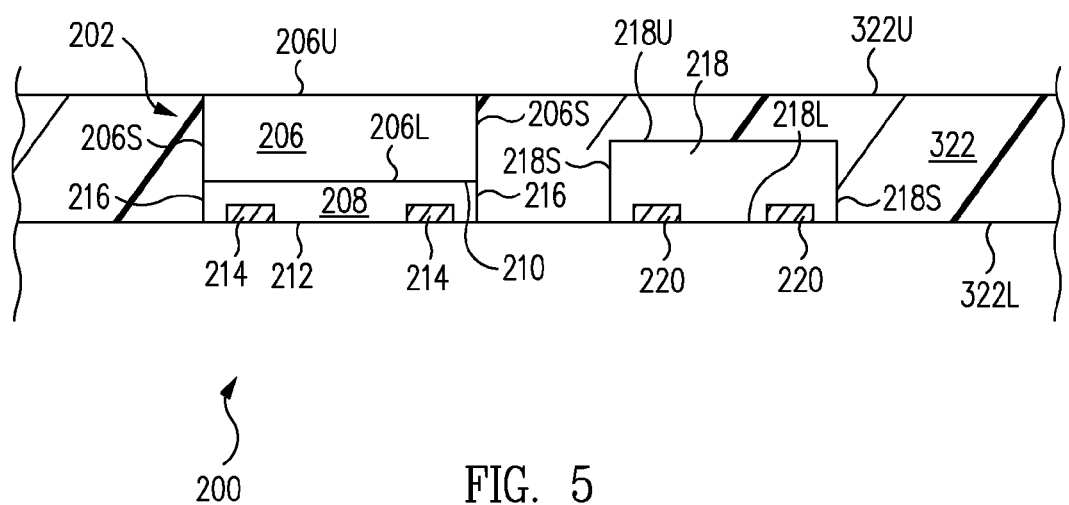
Figure 6:
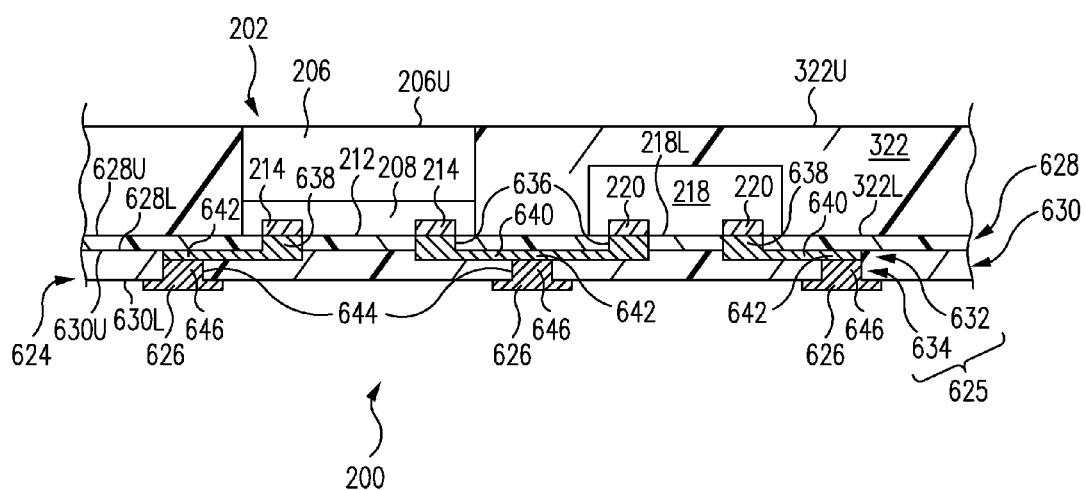

As an overview and in accordance with one embodiment, referring to FIG. 2, a method of forming a light emitting diode (LED) package 200 includes mounting a LED structure 202 to a carrier 204. Referring to FIG. 3, LED structure 202 is overmolded in a package body 322. Referring to FIG. 4, package body 322 is backgrinded to expose LED structure 202. Referring to FIGS. 4 and 5 together, carrier 204 is removed. Referring to FIG. 6, a redistribution layer (RDL) buildup structure 624 including a RDL circuit pattern 625 coupled to a LED 208 of LED structure 202 is formed.

As set forth above, LED package 200 is formed without a substrate in one embodiment. By forming LED package 200 without a substrate, the thickness of LED package 200 is minimized. Further, by forming LED package 200 without a substrate, heat removal from LED 208 is maximized as is electrical performance. Further still, by forming LED package 200 without a substrate, the fabrication cost of LED package 200 is minimized.

Figure 1:
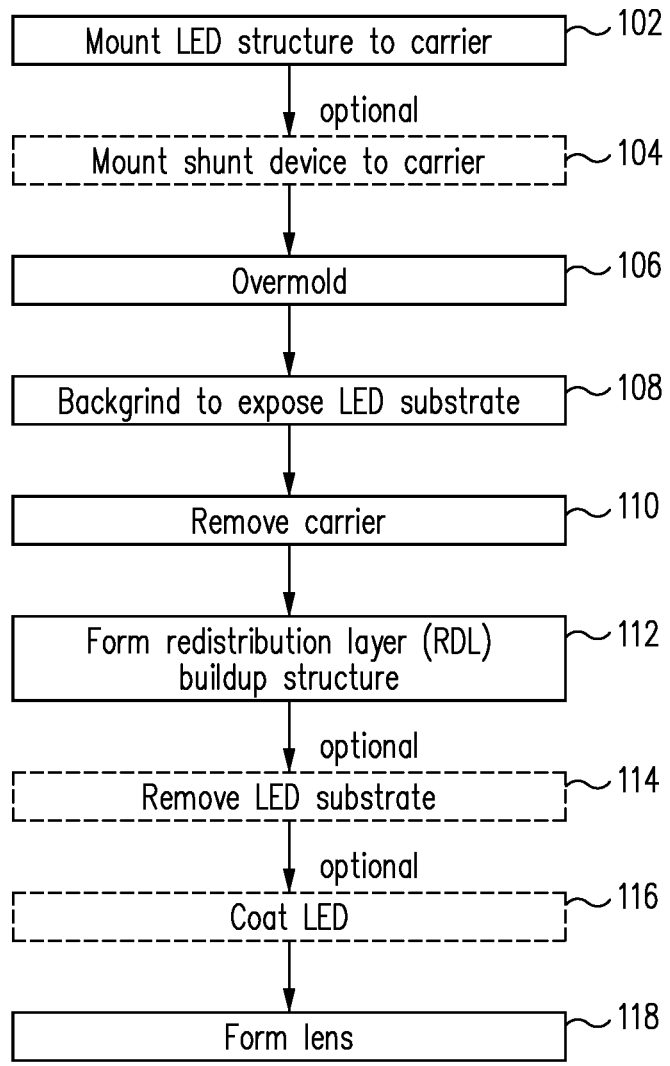
FIG. 1 is a flow diagram of a single LED package formation method in accordance with one embodiment.

Now in more detail, FIG. 1 is a flow diagram of a single LED package formation method 100 in accordance with one embodiment. FIG. 2 is a cross-sectional view of a light emitting diode (LED) package 200 during fabrication in accordance with one embodiment. Referring now to FIGS. 1 and 2 together, in a mount LED structure to carrier operation 102, a LED structure 202 is mounted to a carrier 204.

LED structure 202 includes a LED substrate 206 and a LED 208. LED substrate 206 includes an upper, e.g., first, surface 206U and an opposite lower, e.g., second, surface 206L. LED substrate 206 further includes sides 206S extending between upper surface 206U and lower surface 206L.

Lower surface 206L is connected to a light emitting surface 210, sometimes called an active surface or light emitting face, of LED 208. In one embodiment, LED 208 is a high power and high brightness LED emitter.

LED 208 further includes an inactive surface 212 opposite light emitting surface 210. Bond pads 214, sometimes called input/output (I/O) terminals, are formed on inactive surface 212.

Light emitting surface 210 emits light during use. More particularly, a signal applied to bond pads 214 causes light to be emitted from light emitting surface 210.

LED 208 further includes sides 216 extending between light emitting surface 210 and inactive surface 212. Sides 216 of LED 208 are parallel and coplanar with sides 206S of LED substrate 206.

Generally, LED substrate 206 provides the support structure for formation of LED 208. In one particular embodiment, LED substrate 206 is a sapphire substrate. LED 208 is a gallium nitride (GaN) LED formed on, e.g., grown, on LED substrate 206. Although one particular example of LED structure 202 including a sapphire substrate as LED substrate 206 and a gallium nitride LED as LED 208 is provided, in light of this disclosure, those of skill in the art will understand that LED substrate 206 and LED 208 can be other types of LED substrates and LEDs in other embodiments.

Returning again to mount LED structure to carrier operation 102, inactive surface 212 including bond pads 214 are mounted to an upper, e.g., first, surface 204U of carrier 204, e.g., with an adhesive. In one embodiment, upper surface 204U of carrier 204 is adhesive thus avoiding application of a separate adhesive to mount inactive surface 212 to upper surface 204U of carrier 204.

From mount LED structure to carrier operation 102, flow moves, optionally, to a mount shunt device to carrier operation 104. In mount shunt device to carrier operation 104, a shunt device 218, e.g., a shunt diode, is mounted to carrier 204.

Shunt device 218 includes a lower, e.g., first, surface 218L and an opposite upper, e.g., second, surface 218U. Lower surface 218L includes bond pads 220, e.g., terminals, formed thereon. Shunt device 218 further includes sides 218S extending between lower surface 218L and upper surface 218U.

Returning again to mount shunt device to carrier operation 104, lower surface 218L including bond pads 220 are mounted to upper surface 204U of carrier 204, e.g., with an adhesive. In one embodiment, upper surface 204U of carrier 204 is adhesive thus avoiding application of a separate adhesive to mount lower surface 218L of shunt device 218 to upper surface 204U of carrier 204.

Shunt device 218 is a device which allows electrical current to pass around LED 208 in the event that LED 208 malfunctions and becomes an open circuit. More particularly, LED package 200 is often wired in series with a plurality of LED packages 200. In the event that an LED 208 of a LED package 200 fails and becomes an open circuit, shunt device 218 allows electrical current to pass through the failed LED package 200. In this manner, failure of the entire series of LED packages 200 due to failure of a single LED 208 is avoided. In another embodiment, shunt device 218 is a power diode.

In one embodiment, LED package 200 is fabricated without shunt device 218. In this event, mount shunt device to carrier operation 104 is not performed and thus is an optional operation. In the description and figures that follow, LED package 200 is set forth as including shunt device 218. However, in light of this disclosure, those of skill in the art will understand that LED package 200 is formed without shunt device 218 in other embodiments.

FIG. 3 is a cross-sectional view of LED package 200 of FIG. 2 at a further stage during fabrication in accordance with one embodiment. Referring now to FIGS. 1 and 3 together, from mount shunt device to carrier operation 104 (or directly from mount LED structure to carrier operation 102 if optional mount shunt device to carrier operation 104 is not performed), flow moves to an overmold operation 106. In overmold operation 106, LED structure 202 and shunt device 218 are overmolded in a package body 322.

Package body 322 is a dielectric material, e.g., is molding compound, cured liquid encapsulant, or other dielectric material. Package body 322 completely encloses LED structure 202 and shunt device 218.

More particularly, package body 322 includes an upper, e.g., first, surface 322U and a lower, e.g., second, surface 322L. Upper surface 322U is spaced apart from and above upper surface 206U of LED substrate 206 and upper surface 218U of shunt device 218 such that package body 322 exists between upper surface 322U and upper surfaces 206U, 218U. Package body 322 directly contacts and encloses upper surface 206U and sides 206S of LED substrate 206, sides 216 of LED 208, and upper surface 218U and sides 218S of shunt device 218. By embedding LED 208 in package body 322, higher surface reflectivity is achieved.

Further, lower surface 322L of package body 322 directly contacts and encloses the exposed portions of upper surface 204U of carrier 204. Generally, lower surface 322L of package body 322 is parallel to and coplanar with inactive surface 212 of LED 208 and lower surface 218L of shunt device 218.

In one embodiment, a plurality of LED structures 202 and shunt devices 218 are attached to carrier 204 during the fabrication of a plurality of LED packages 200 simultaneously. The plurality of LED structures 202 and shunt devices 218 are enclosed within package body 322 and reconstituted into a larger format wafer, sometimes called a reconstituted wafer. Thus, although the fabrication of a single LED package 200 is described herein, in light of this disclosure, those of skill in the art will understand that a plurality of LED packages 200 are simultaneously fabricated in other embodiments.

FIG. 4 is a cross-sectional view of LED package 200 of FIG. 3 at a further stage during fabrication in accordance with one embodiment. Referring now to FIGS. 1 and 4 together, from overmold operation 106, flow moves to a backgrind to expose LED substrate operation 108. In backgrind to expose LED substrate operation 108, package body 322 is backgrinded to expose LED substrate 206.

More particularly, package body 322 is backgrinded, e.g., removed, from upper surface 322U. Generally, package body 322 is thinned to expose upper surface 206U of LED substrate 206.

After performance of backgrind to expose LED substrate operation 108, upper surface 206U of LED substrate 206 is parallel to and coplanar with upper surface 322U of package body 322 as illustrated in FIG. 4. Accordingly, upper surface 206U of LED substrate 206 is exposed from package body 322.

However, shunt device 218 remains enclosed within package body 322. More particularly, the thickness of LED structure 202 is greater than the thickness of shunt device 218. Accordingly, upper surface 206U of LED substrate 206 is exposed from package body 322 while upper surface 218U of shunt device 218 remains in direct contact with and enclosed within package body 322.

FIG. 5 is a cross-sectional view of LED package 200 of FIG. 4 at a further stage during fabrication in accordance with one embodiment. Referring now to FIGS. 1, 4, and 5 together, from backgrind to expose LED substrate operation 108, flow moves to a remove carrier operation 110. In remove carrier operation 110, carrier 204 is removed.

More particularly, package body 322 is a relatively rigid structure thus providing strength and support for LED package 200. Accordingly, after formation of package body 322, carrier 204 is removed.

Carrier 204 is removed using any one of a number of techniques, e.g., by peeling, heating, grinding, or other removal technique. Removal of carrier 204 exposes inactive surface 212 including bond pads 214 of LED 208, lower surface 218L including bond pads 220 of shunt device 218, and lower surface 322L of package body 322 as illustrated in FIG. 5.

FIG. 6 is a cross-sectional view of LED package 200 of FIG. 5 at a further stage during fabrication in accordance with one embodiment. Referring now to FIGS. 1 and 6 together, from remove carrier operation 110, flow moves to a form redistribution layer (RDL) buildup structure operation 112. In form RDL buildup structure operation 112, a RDL buildup structure 624 is formed.

RDL buildup structure 624 includes a RDL circuit pattern 625 that redistributes the pattern of bond pads 214, 220 to a pattern of RDL terminals 626. In accordance with this embodiment, RDL buildup structure 624 includes a first buildup dielectric layer 628, a second buildup dielectric layer 630, a first buildup circuit pattern 632, and a second buildup circuit pattern 634. First buildup circuit pattern 632 and second buildup circuit pattern 634 form RDL circuit pattern 625 in this embodiment.

First buildup dielectric layer 628 includes an upper, e.g., first, surface 628U and an opposite lower, e.g., second, surface 628L. Upper surface 628U is attached to inactive surface 212 including bond pads 214 of LED 208, lower surface 218L including bond pads 220 of shunt device 218, and lower surface 322L of package body 322 as illustrated in FIG. 6.

Via apertures 636 are formed through first buildup dielectric layer 628 and extend between lower surface 628L and upper surface 628U. Via aperture 636 expose bond pads 214 of LED 208 and bond pads 220 of shunt device 218.

First buildup circuit pattern 632 is formed on or embedded within first buildup dielectric layer 628. First buildup circuit pattern 632 includes electrically conductive vias 638 electrically connected to bond pads 214 of LED 208 and bond pads 220 of shunt device 218 through via apertures 636.

First buildup circuit pattern 632 further includes electrically conductive traces 640 on or embedded within lower surface 628L of first buildup dielectric layer 628. Traces 640 are electrically connected to vias 638 and include terminals 642.

Second buildup dielectric layer 630 also includes an upper, e.g., first, surface 630U and an opposite lower, e.g., second, surface 630L. Upper surface 630U is attached to lower surface 628L of first buildup dielectric layer 628 and covers first buildup circuit pattern 632 as illustrated in FIG. 6.

Via apertures 644 are formed through second buildup dielectric layer 630 and extend between lower surface 630L and upper surface 630U. Via apertures 644 expose terminals 642 of first buildup circuit pattern 632.

Second buildup circuit pattern 634 is formed on or embedded within second buildup dielectric layer 630. Second buildup circuit pattern 634 includes electrically conductive vias 646 electrically connected to terminals 642 of first buildup circuit pattern 632 through via apertures 644.

Second buildup circuit pattern 634 further includes electrically conductive RDL terminals 626 on or embedded within lower surface 630L of second buildup dielectric layer 630. RDL terminals 626 are electrically connected to vias 646, e.g., are formed directly thereon or are connected thereto by traces (not shown) of second buildup circuit pattern 634.

Accordingly, bond pads 214 of LED 208 and bond pads 220 of shunt device 218 are electrically connected to RDL terminals 626 by RDL circuit pattern 625 as set forth above. RDL terminals 626, sometimes called a package I/O array, are electrically connected to a larger substrate, e.g., a printed circuit mother board, sometimes called a second level assembly. In one embodiment, RDL terminals 626 are solder printed to form LGA pads.

Although a particular RDL buildup structure 624 is illustrated in FIG. 6 and discussed above, in light of this disclosure, those of skill in the art will understand that any one of a number of RDL buildup structures can be formed depending upon the particular input/output structure and routing desired.

Figure 7:
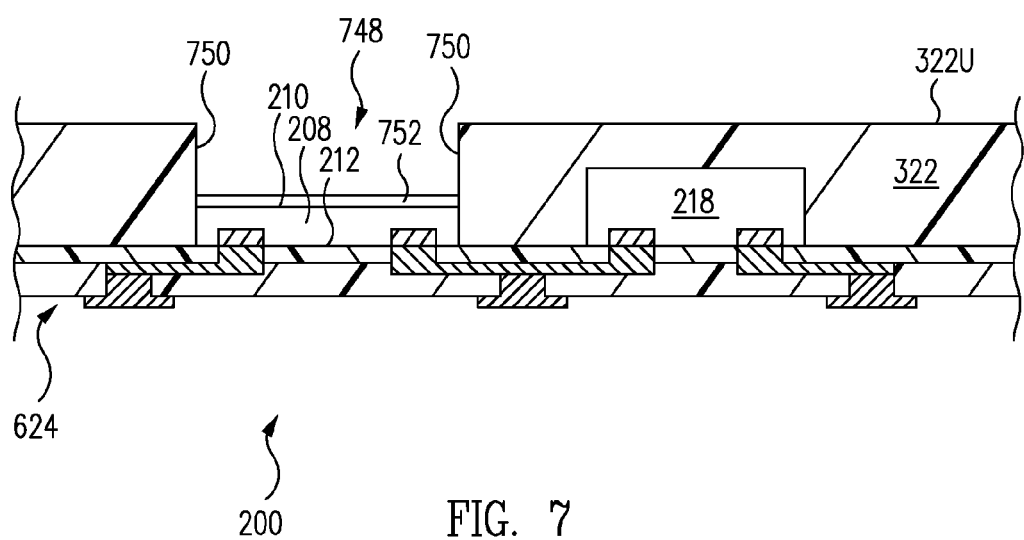

FIG. 7 is a cross-sectional view of LED package 200 of FIG. 6 at a further stage during fabrication in accordance with one embodiment. Referring now to FIGS. 1, 6 and 7 together, from form RDL buildup structure operation 112, flow moves to a remove LED substrate operation 114. In remove LED substrate operation 114, LED substrate 206 as illustrated in FIG. 6 is removed as illustrated in FIG. 7.

In one embodiment, a laser lift-off process is used to remove LED substrate 206. In accordance with this embodiment, laser light is directed at upper surface 206U of LED substrate 206. This laser light passes through LED substrate 206 to lower surface 206L. This laser light causes decomposition of the interface between lower surface 206L of LED substrate 206 and light emitting surface 210 of LED 208 thus causing detachment of LED substrate 206 from LED 208. Once detached, LED substrate 206 is readily removed.

Removal of LED substrate 206 creates a LED cavity 748 in package body 322 and directly exposes light emitting surface 210 of LED 208. More particularly, LED cavity 748 is defined by LED cavity sidewalls 750 of package body 322 and light emitting surface 210 of LED 208. LED cavity sidewalls 750 extend between upper surface 322U of package body 322 and light emitting surface 210 of LED 208.

From remove LED substrate operation 114, optionally, flow moves to a coat LED operation 116. In coat LED operation 116, light emitting surface 210 of LED 208 is coated with a LED coating 752. As illustrated in FIG. 7, LED coating 752 is applied directly to light emitting surface 210 of LED 208 and partially fills LED cavity 748.

LED coating 752 enhances or changes the color of the light emitted from LED 208. For example, LED 208 emits a colored light, e.g., blue light. The light emitted from LED 208 is absorbed by LED coating 752, e.g., phosphor, which, in turn, emits white light. In another example, LED coating 752 converts a portion of the light, e.g., blue light, emitted from LED 208 to another color, e.g., yellow, and the resulting mix of the two colored lights, e.g., blue and yellow, gives the appearance of white light. In another example, LED coating 752 is silicon that is added to produce colored light from LED 208.

In one embodiment, LED coating 752 is not formed. In accordance with this embodiment, coat LED operation 116 is not performed and so is an optional operation.

Figure 8:
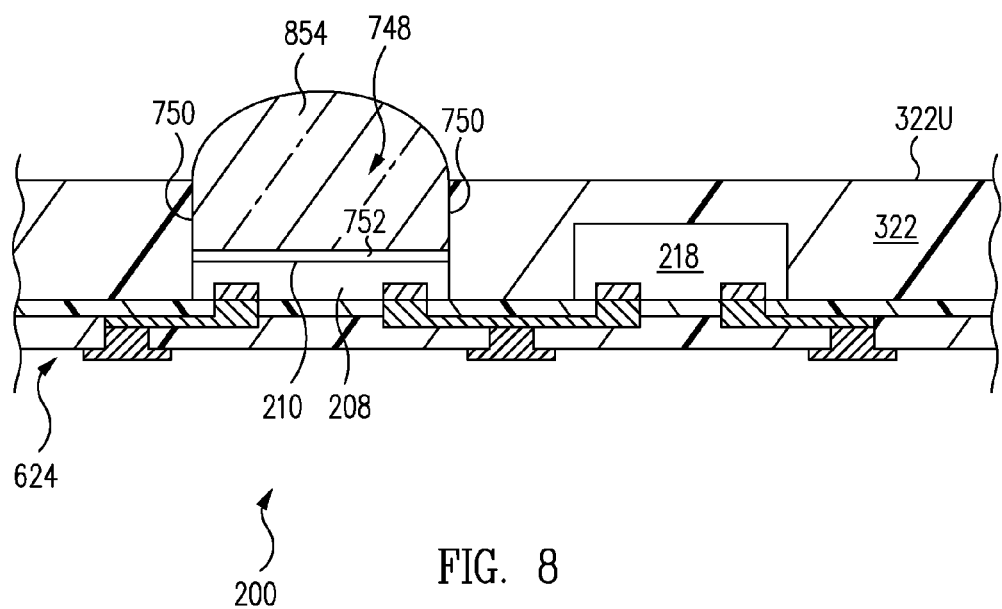

FIG. 8 is a cross-sectional view of LED package 200 of FIG. 7 at a further stage during fabrication in accordance with one embodiment. Referring now to FIGS. 1 and 8 together, from coat LED operation 116 (or from remove LED substrate operation 114 in the event that coat LED operation 116 is not performed), flow moves to a form lens operation 118. In form lens operation 118, a lens 854 is formed, e.g., molded in place or attached as a secondary piece part.

As illustrated in FIG. 8, lens 854 is formed directly above light emitting surface 210 of LED 208. In one embodiment, lens 854 is transparent to the light emitted from LED 208. In accordance with this embodiment, lens 854 is formed directly on LED coating 752 and fills LED cavity 748. Lens 854 protrudes above upper surface 322U of package body 322 in this embodiment. In one embodiment, lens 854 is an optical element which converges or diverges light from LED 208.

In one embodiment where a plurality of LED packages 200 are formed simultaneously, after form lens operation 118, the reconstituted wafer is singulated, e.g., by cutting with a saw, laser, or other singulation technique, to singulate the LED packages 200 from one another. By reconstituting to a large format wafer, the cost of fabricating LED packages 200 is minimized while at the same time scalability to large volumes is achieved.

As set forth above, LED package 200 is formed using a Wafer Level Fan Out (WLFO) process to form LED package 200 without a substrate in one embodiment. By forming LED package 200 without a substrate, the thickness of LED package 200 is minimized. Further, by forming LED package 200 without a substrate, heat removal from LED 208 is maximized as is electrical performance. Further still, by forming LED package 200 without a substrate, the fabrication cost of LED package 200 is minimized.

Figure 8A:
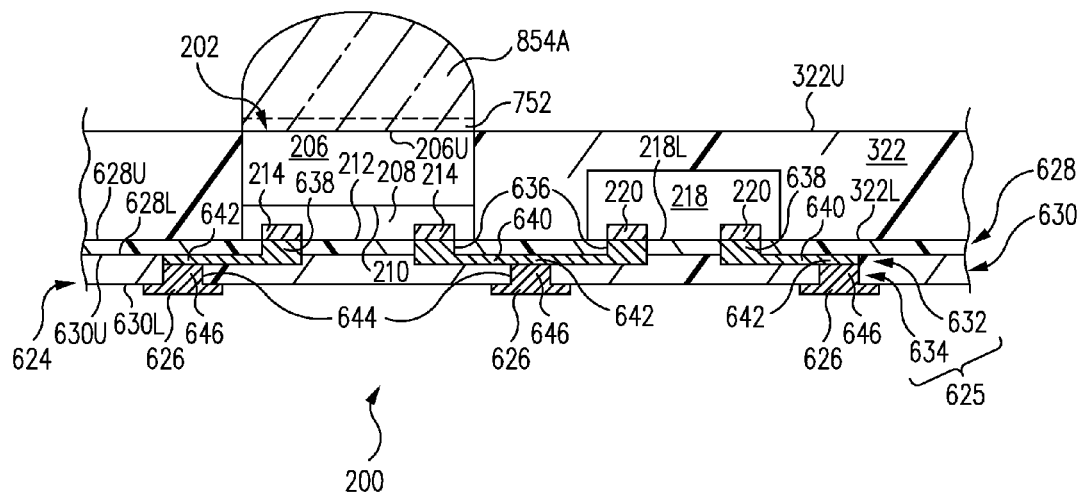
FIG. 8A is a cross-sectional view of the LED package of FIG. 6 at a further stage during fabrication in accordance with another embodiment.

FIG. 8A is a cross-sectional view of LED package 200 of FIG. 6 at a further stage during fabrication in accordance with another embodiment. Referring now to FIGS. 1, 6 and 8A together, in accordance with this embodiment, remove LED substrate operation 114 is not performed and thus is an optional operation. Thus, as illustrated in FIG. 8A, LED package 200 includes LED substrate 206 in the final assembly. Light emitted from light emitting surface 210 passes through LED substrate 206 in this embodiment.

In one embodiment, coat LED operation 116 is performed to form LED coating 752 on upper surface 206U of LED substrate 206 as indicated by the dashed line. In another embodiment, coat LED operation 116 is not performed such that LED coating 752 is not formed.

As further illustrated in FIG. 8A, in form lens operation 118, a lens 854A is formed. Lens 854A is formed directly on LED coating 752 or alternatively directly on upper surface 206U of LED substrate 206 in the event that LED coating 752 is not formed. In one embodiment, lens 854A is transparent to the light emitted from LED 208 and generally from LED structure 202. Lens 854A protrudes above upper surface 322U of package body 322 and also above LED substrate 206 in this embodiment. In one embodiment, lens 854A is an optical element which converges or diverges light from LED structure 202.

Although not illustrated or discussed below, in any of the following LED packages, LED substrate 206 can optionally not be removed and remain in the final assembly of the LED package. Stated another way, remove LED substrate operation 114 is optional and not performed in multiple LED package formation methods 900, 1600, 2200 of FIGS. 9, 16, 22 in accordance with other embodiments. Further, in accordance with these other embodiments, LED coating 752 can be formed on upper surface 206U of LED substrate 206. Further, in accordance with these other embodiments, the respective lens can be formed on LED coating 752 or on upper surface 206U of LED substrate 206.

Figure 9:
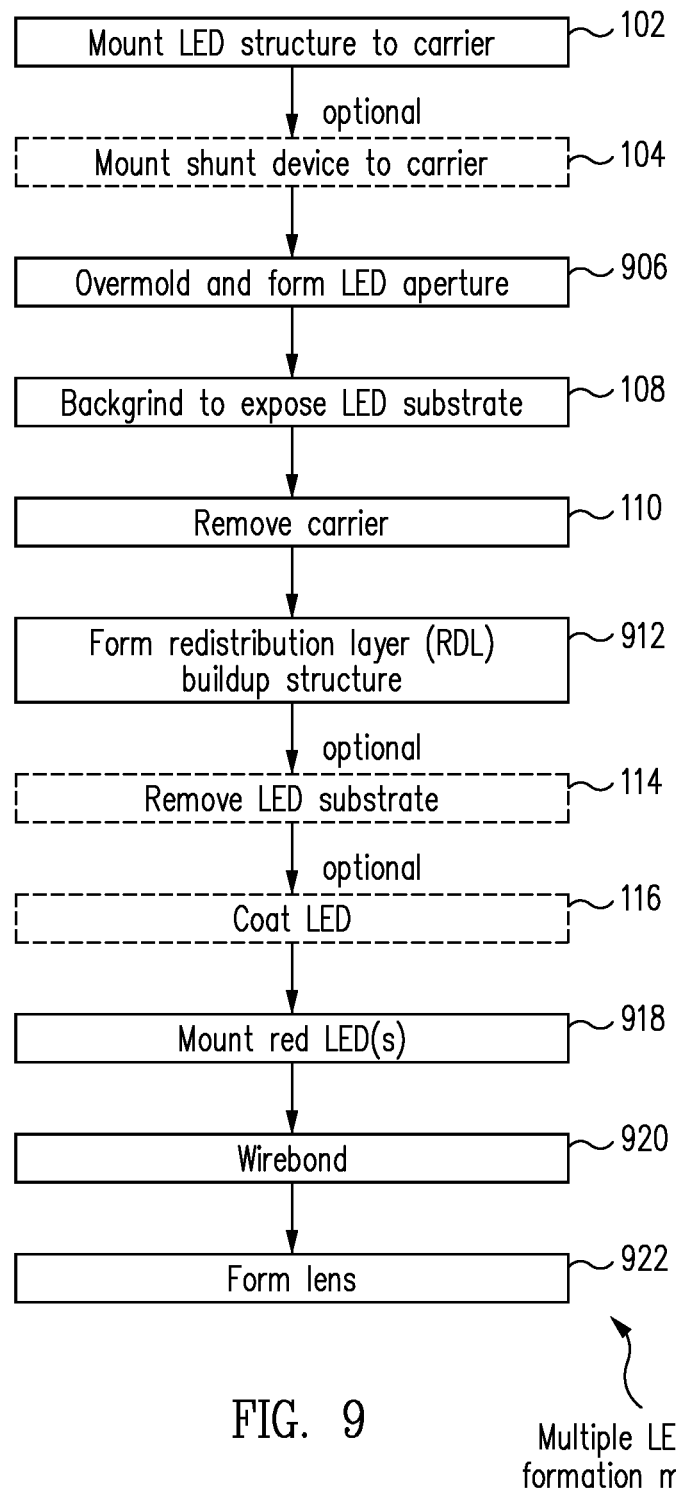
FIG. 9 is a flow diagram of a multiple LED package formation method in accordance with one embodiment.

FIG. 9 is a flow diagram of a multiple LED package formation method 900 in accordance with one embodiment. Mount LED structure to carrier operation 102, mount shunt device to carrier operation 104, backgrind to expose LED substrate operation 108, remove carrier operation 110, remove LED substrate operation 114, and coat LED operation 116 of multiple LED package formation method 900 of FIG. 9 are similar or identical to mount LED structure to carrier operation 102, mount shunt device to carrier operation 104, backgrind to expose LED substrate operation 108, remove carrier operation 110, remove LED substrate operation 114, and coat LED operation 116 of single LED package formation method 100 of FIG. 1, respectively, and so are only briefly described below.

Figure 10:
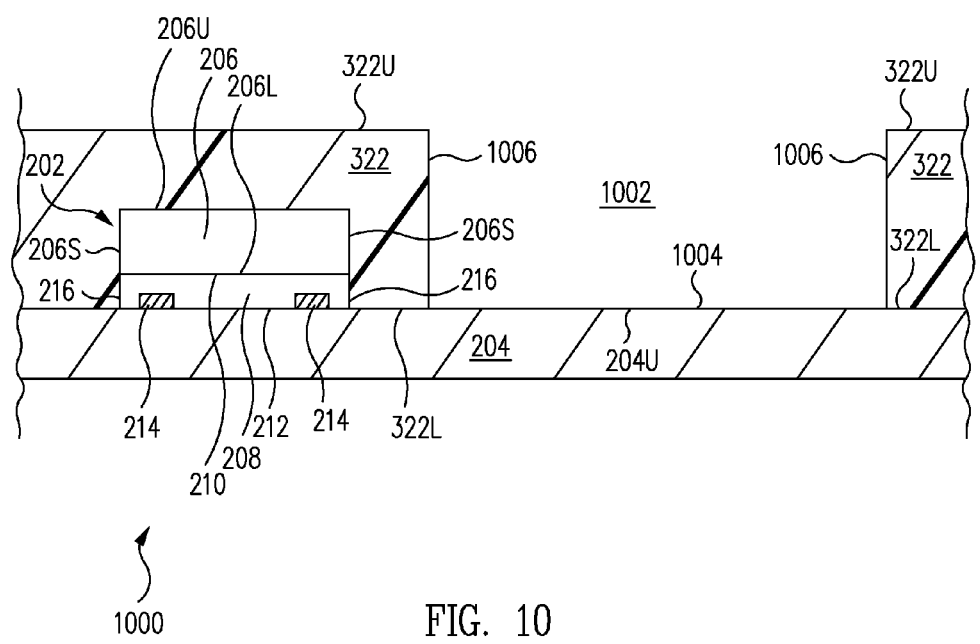
FIG. 10 is a cross-sectional view of a LED package during fabrication in accordance with one embodiment.

FIG. 10 is a cross-sectional view of a LED package 1000 during fabrication in accordance with one embodiment. Referring now to FIGS. 9 and 10 together, LED structure 202 is mounted to carrier 204 in mount LED structure to carrier operation 102. A shunt device (similar to shunt device 218 of FIGS. 2-8) is mounted to carrier 204 in mount shunt device to carrier operation 104. For purposes of simplicity, the shunt device is not illustrated in the following figures but is mounted and electrically connected in a manner similar to that set forth above regarding FIGS. 2-8, the discussion of which is incorporated here.

From mount shunt device to carrier operation 104 (or optionally from mount LED structure to carrier operation 102 in the event that mount shunt device to carrier operation 104 is not performed), flow moves to an overmold and form LED aperture operation 906.

In overmold and form LED aperture operation 906, LED structure 202 is overmolded in package body 322. Further, in overmold and form LED aperture operation 906, a LED aperture 1002 is formed within package body 322. For example, LED aperture 1002 is formed during formation, e.g., molding, of package body 322. In another embodiment, package body 322 is formed and then LED aperture 1002 is formed within package body 322, e.g., by using laser ablation or other removal technique.

LED aperture 1002 extends entirely through package body 322 and between upper surface 322U and lower surface 322L. LED aperture 1002 exposes a LED bonding area 1004 in which a RDL circuit pattern will be bonded to one or more red LEDs as discussed further below. LED bonding area 1004 is a portion of upper surface 204U of carrier 204 exposed through LED aperture 1002 at this stage during fabrication. Thus, LED aperture 1002 is defined by LED aperture sidewalls 1006 of package body 322 that extend between upper surface 322U and lower surface 322L and LED bonding area 1004 at this stage during fabrication.

In one embodiment, a plurality of LED structures 202 are attached to carrier 204 during the fabrication of a plurality of LED packages 1000 simultaneously. The plurality of LED structures 202 are enclosed within package body 322 and reconstituted into a larger format wafer, sometimes called a reconstituted wafer. Thus, although the fabrication of a single LED package 1000 is described herein, in light of this disclosure, those of skill in the art will understand that a plurality of LED packages 1000 are simultaneously fabricated in other embodiments.

Figure 11:
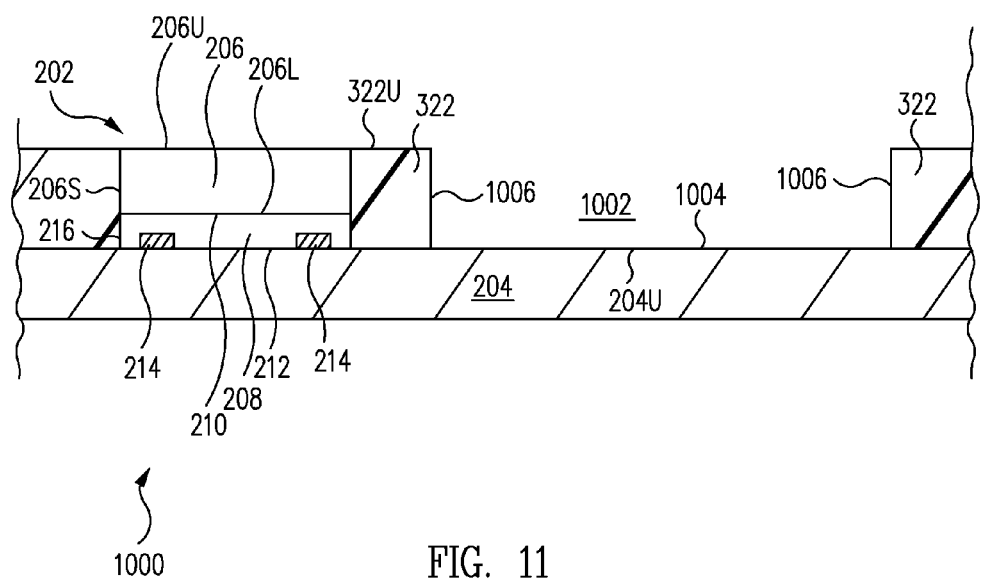
FIGS. 11, 12, 13, 14, 15 are cross-sectional views of the LED package of FIG. 10 at further stages during fabrication in accordance with various embodiments.

FIG. 11 is a cross-sectional view of LED package 1000 of FIG. 10 at a later stage during fabrication in accordance with one embodiment. Referring now to FIGS. 9 and 11 together, from overmold and form LED aperture operation 906, flow moves to backgrind to expose LED substrate operation 108. In backgrind to expose LED substrate operation 108, package body 322 is backgrinded to expose upper surface 206U of LED substrate 206 as illustrated in FIG. 11.

Figure 12:
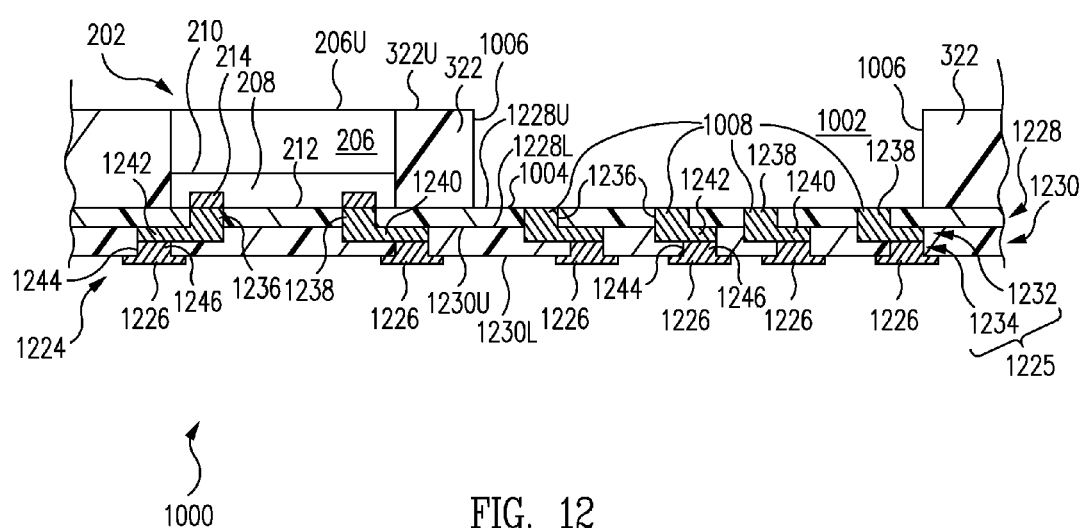

FIG. 12 is a cross-sectional view of LED package 1000 of FIG. 11 at a later stage during fabrication in accordance with one embodiment. Referring now to FIGS. 9, 11, and 12 together, from backgrind to expose LED substrate operation 108, flow moves to remove carrier operation 110. In remove carrier operation 110, carrier 204 is removed. Removal of carrier 204 exposes LED aperture 1002 at lower surface 322U of package body 322 such that LED aperture 1002 is an exposed opening that extends entirely though package body 322.

From remove carrier operation 110, flow moves to a form redistribution layer (RDL) buildup structure operation 912. In form RDL buildup structure operation 912, a RDL buildup structure 1224 is formed.

RDL buildup structure 1224 includes a RDL circuit pattern 1225 that redistributes the pattern of bond pads 214 to a pattern of RDL terminals 1226. In accordance with this embodiment, RDL buildup structure 1224 includes a first buildup dielectric layer 1228, a second buildup dielectric layer 1230, a first buildup circuit pattern 1232, and a second buildup circuit pattern 1234. First buildup circuit pattern 1232 and second buildup circuit pattern 1234 form RDL circuit pattern 1225 in this embodiment.

First buildup dielectric layer 1228 includes an upper, e.g., first, surface 1228U and an opposite lower, e.g., second, surface 1228L. Upper surface 1228U is attached to inactive surface 212 including bond pads 214 of LED 208 and lower surface 322L of package body 322 as illustrated in FIG. 12. Further, first buildup dielectric layer 1228 seals LED aperture 1002 at lower surface 322L of package body 322. Accordingly, LED bonding area 1004 is defined by the portion of upper surface 1228U of first buildup dielectric layer 1228 exposed through LED aperture 1002 at this stage of fabrication.

Via apertures 1236 are formed through first buildup dielectric layer 1228 and extend between lower surface 1228L and upper surface 1228U. Via aperture 1236 expose bond pads 214 of LED 208. Further, via apertures 1236 within LED bonding area 1004 correspond with LED terminals to be formed within bonding area 1004 as discussed further below.

First buildup circuit pattern 1232 is formed on or embedded within first buildup dielectric layer 1228. First buildup circuit pattern 1232 includes electrically conductive vias 1238 electrically connected to bond pads 214 of LED 208 through via apertures 1236. Further, the ends of vias 1238 within bonding area 1004 form LED terminals 1008 for the one or more red LEDs to be mounted within LED aperture 1002 as discussed further below. LED terminals 1008 are exposed through LED aperture 1002.

First buildup circuit pattern 1232 further includes electrically conductive traces 1240 on or embedded within lower surface 1228L of first buildup dielectric layer 1228. Traces 1240 are electrically connected to vias 1238 and include terminals 1242.

Second buildup dielectric layer 1230 also includes an upper, e.g., first, surface 1230U and an opposite lower, e.g., second, surface 1230L. Upper surface 1230U is attached to lower surface 1228L of first buildup dielectric layer 1228 and covers first buildup circuit pattern 1232 as illustrated in FIG. 12.

Via apertures 1244 are formed through second buildup dielectric layer 1230 and extend between lower surface 1230L and upper surface 1230U. Via apertures 1244 expose terminals 1242 of first buildup circuit pattern 1232.

Second buildup circuit pattern 1234 is formed on or embedded within second buildup dielectric layer 1230. Second buildup circuit pattern 1234 includes electrically conductive vias 1246 electrically connected to terminals 1242 of first buildup circuit pattern 1232 through via apertures 1244.

Second buildup circuit pattern 1234 further includes electrically conductive RDL terminals 1226 on lower surface 1230L of second buildup dielectric layer 1230. RDL terminals 1226 are electrically connected to vias 1246, e.g., are formed directly thereon or are connected thereto by traces (not shown) of second buildup circuit pattern 1234.

Accordingly, bond pads 214 of LED 208 are electrically connected to RDL terminals 1226 by RDL circuit pattern 1225 as set forth above. Further, LED terminals 1008 are electrically connected to RDL terminals 1226 by RDL circuit pattern 1225 as set forth above. RDL terminals 1226, sometimes called a package I/O array, are electrically connected to a larger substrate, e.g., a printed circuit mother board, sometimes called a second level assembly.

Although a particular RDL buildup structure 1224 is illustrated in FIG. 12 and discussed above, in light of this disclosure, those of skill in the art will understand that any one of a number of RDL buildup structures can be formed depending upon the particular input/output structure and routing desired.

Figure 13:
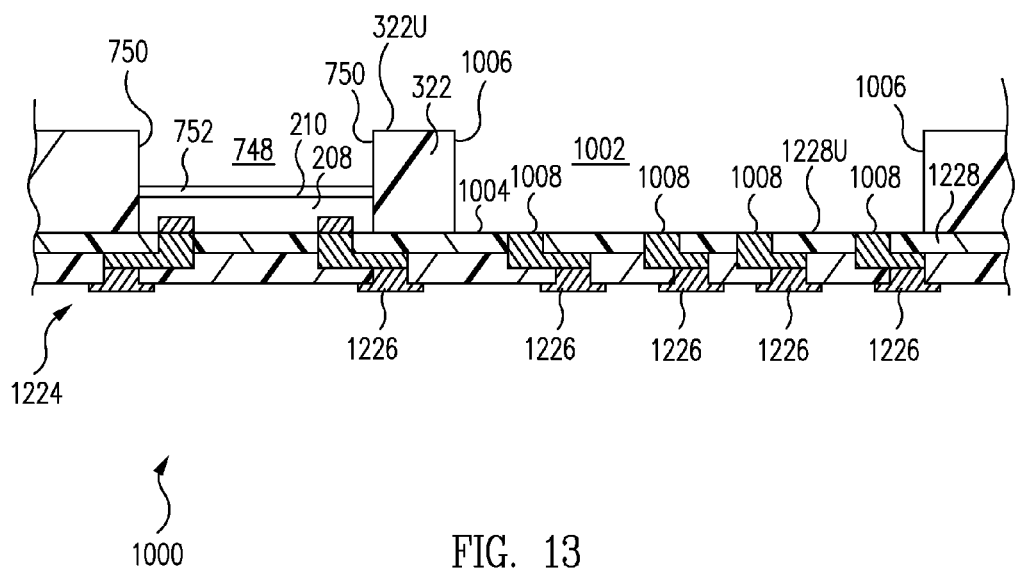

FIG. 13 is a cross-sectional view of LED package 1000 of FIG. 12 at a further stage during fabrication in accordance with one embodiment. Referring now to FIGS. 9, 12 and 13 together, from form RDL buildup structure operation 912, flow moves to a remove LED substrate operation 114. In remove LED substrate operation 114, LED substrate 206 as illustrated in FIG. 12 is removed as illustrated in FIG. 13.

From remove LED substrate operation 114, optionally, flow moves to coat LED operation 116. In coat LED operation 116, light emitting surface 210 of LED 208 is coated with LED coating 752 in a manner similar to that discussed above.

Figure 14:
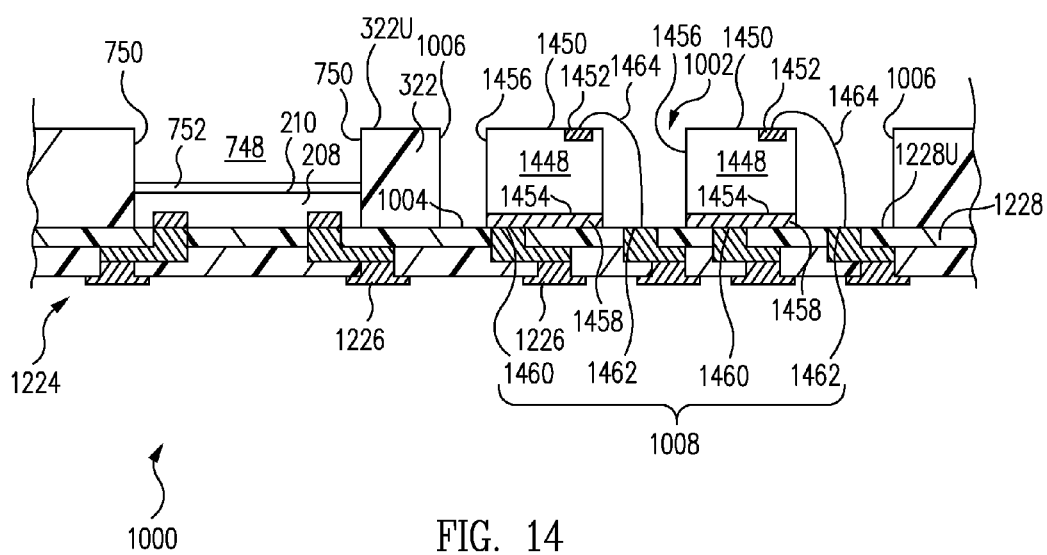

FIG. 14 is a cross-sectional view of LED package 1000 of FIG. 13 at a further stage during fabrication in accordance with one embodiment. Referring now to FIGS. 9 and 14 together, from coat LED operation 116 (or optionally from remove LED substrate operation 114 in the event that coat LED operation 116 is not performed), flow moves to a mount red LED(s) operation 918. In mount red LED(s) operation 918, one or more red LEDs 1448 are mounted to RDL buildup structure 1224. Generally, red LEDs are sometimes called supplementary LEDS as the red LEDs are supplemental to LED 208, which is sometimes called the primary LED.

In accordance with this embodiment, two red LEDs 1448 are mounted. Although two red LEDs 1448 are illustrated in the figures and discussed below, in another embodiment, only a single red LED 1448 is mounted. In yet another embodiment, three or more red LEDs 1448 are mounted. Generally, at least one red LED 1448 is mounted.

In accordance with this embodiment, red LEDs 1448 include light emitting surfaces 1450 having bond pads 1452 formed thereon. Red LEDs 1448 further include inactive surfaces 1454, and sides 1456 extending between light emitting surfaces 1450 and inactive surfaces 1454.

In mount red LED(s) operation 918, inactive surfaces 1454 are mounted generally to RDL buildup structure 1224 and specifically to upper surface 1228U of first buildup dielectric layer 1228 with an electrically conductive adhesive 1458. Red LEDs 1448 are mounted within LED aperture 1002. In accordance with this embodiment, LED terminals 1008 include inactive surface LED terminals 1460, i.e., a first set of LED terminals 1008, and light emitting surface LED terminals 1462, i.e., a second set of LED terminals 1008.

Inactive surfaces 1454 are mounted directly over and thus electrically connected to inactive surface LED terminals 1460 by electrically conductive adhesive 1458. Accordingly, inactive surfaces 1454 are electrically connected to respective RDL terminals 1226.

Red LEDs 1448 do not cover the entire LED bonding area 1004. More particularly, light emitting surface LED terminals 1462 remain exposed and uncovered by red LEDs 1448.

From mount red LEDs operation 918, flow moves to a wirebond operation 920. In wirebond operation 920, bond pads 1452 of red LEDs 1448 are electrically connected to light emitting surface LED terminals 1462 by electrically conductive bond wires 1464.

Light emitting surfaces 1450 emit light, e.g., red light, during use. More particularly, a signal applied to inactive surfaces 1454 and bond pads 1452 causes light to be emitted from light emitting surfaces 1450.

Figure 15:
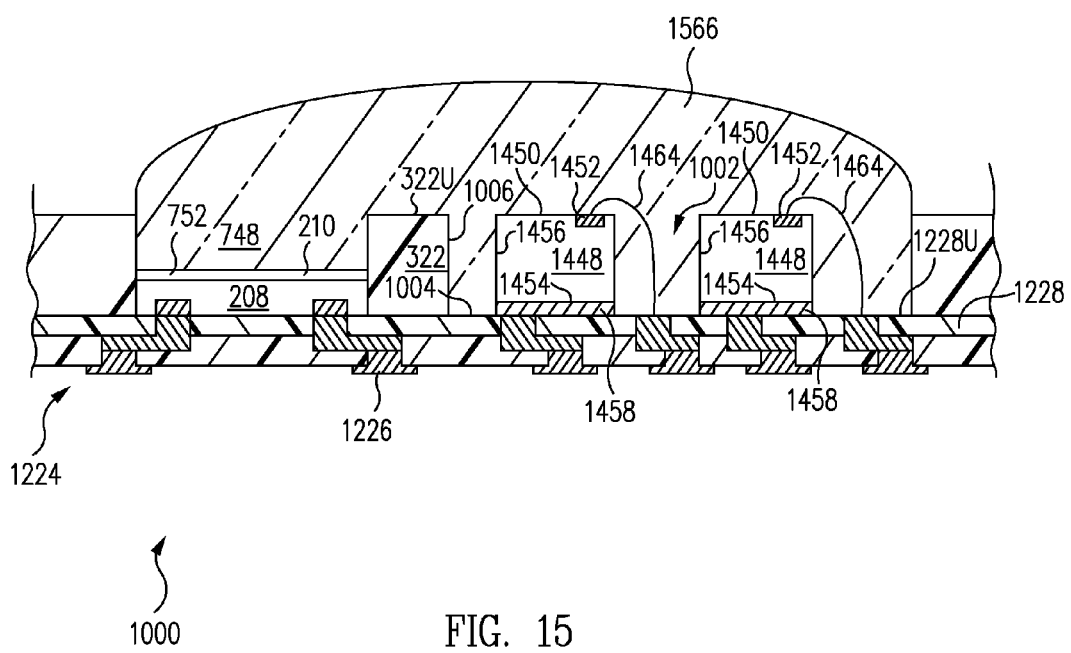

FIG. 15 is a cross-sectional view of LED package 1000 of FIG. 14 at a further stage during fabrication in accordance with one embodiment. Referring now to FIGS. 9 and 15 together, from wirebond operation 920, flow moves to a form lens operation 922. In form lens operation 922, a lens 1566 is formed, e.g., molded in place or attached as a secondary piece part.

As illustrated in FIG. 15, lens 1566 is formed directly above light emitting surface 210 of LED 208 and light emitting surfaces 1450 of red LEDs 1448. In one embodiment, lens 1566 is transparent to the light emitted from LED 208 and red LEDs 1448. In accordance with this embodiment, lens 1566 is formed directly on LED coating 752 and fills LED cavity 748. Lens 1566 further extends over and encapsulates red LEDs 1448 including bond wires 1464 and fills LED aperture 1002.

In one embodiment, lens 1566 is an optical element which converges or diverges light from LED 208 and red LEDs 1448. In one particular embodiment, lens 1566 mixes light from LED 208, e.g., white light, with light from red LEDs 1448, e.g., red light, to provide a white light that is perceived as warmer white light than the white light emitted from LED 208 alone.

In one embodiment where a plurality of LED packages 1000 are formed simultaneously, after form lens operation 922, the reconstituted wafer is singulated, e.g., by cutting with a saw, laser, grinding, or other singulation technique, to singulate the LED packages 1000 from one another. By reconstituting to a large format wafer, the cost of fabricating LED packages 1000 is minimized while at the same time scalability to large volumes is achieved.

As set forth above, LED package 1000 is formed using a WLFO process to form LED package 1000 without a substrate in one embodiment. By forming LED package 1000 without a substrate, the thickness of LED package 1000 is minimized. Further, by forming LED package 1000 without a substrate, heat removal from LED 208 and red LEDs 1448 is maximized as is electrical performance. Further still, by forming LED package 1000 without a substrate, the fabrication cost of LED package 1000 is minimized.

Figure 16:
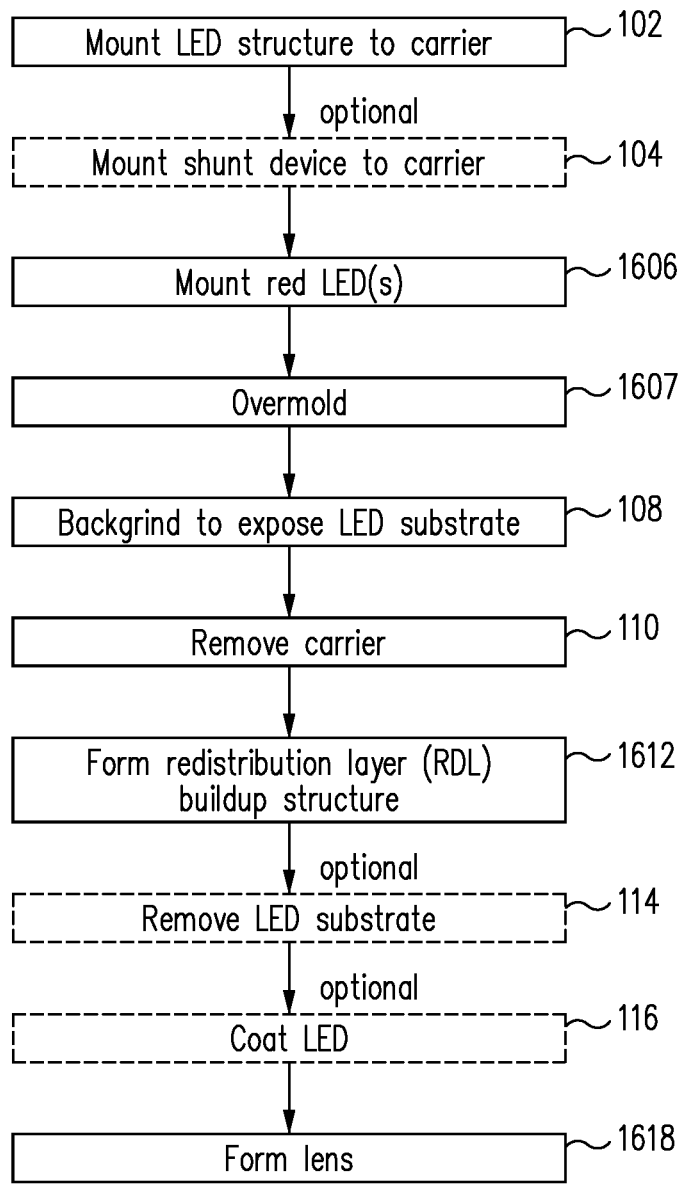
FIG. 16 is a flow diagram of a multiple LED package formation method in accordance with another embodiment.

FIG. 16 is a flow diagram of a multiple LED package formation method 1600 in accordance with another embodiment. Mount LED structure to carrier operation 102, mount shunt device to carrier operation 104, backgrind to expose LED substrate operation 108, remove carrier operation 110, remove LED substrate operation 114, and coat LED operation 116 of multiple LED package formation method 1600 of FIG. 16 are similar or identical to mount LED structure to carrier operation 102, mount shunt device to carrier operation 104, backgrind to expose LED substrate operation 108, remove carrier operation 110, remove LED substrate operation 114, and coat LED operation 116 of single LED package formation method 100 of FIG. 1, respectively, and so are only briefly described below.

Figure 17:
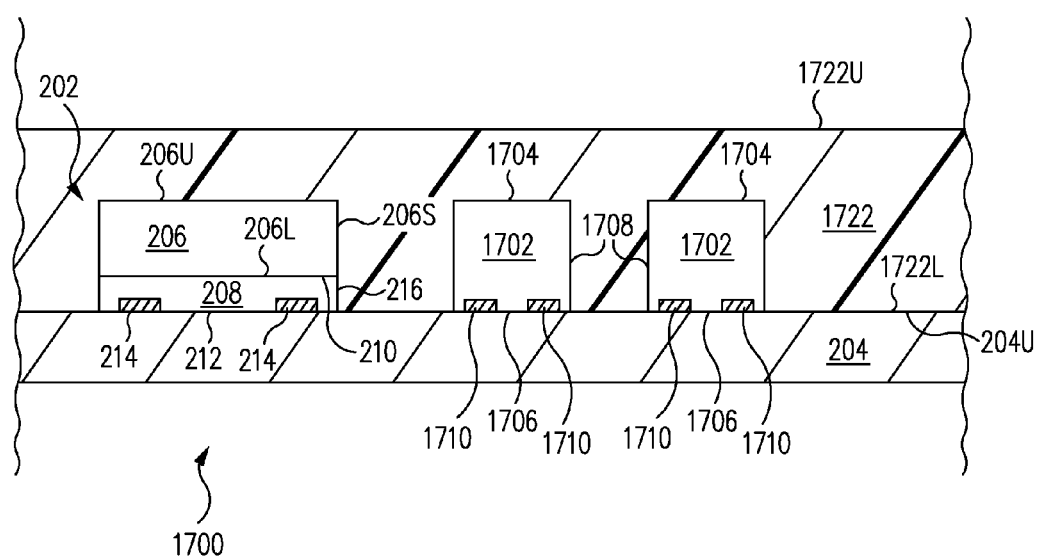
FIG. 17 is a cross-sectional view of a LED package during fabrication in accordance with one embodiment.

FIG. 17 is a cross-sectional view of a LED package 1700 during fabrication in accordance with one embodiment. Referring now to FIGS. 16 and 17 together, LED structure 202 is mounted to carrier 204 in mount LED structure to carrier operation 102. A shunt device (similar to shunt device 218 of FIGS. 2-8) is mounted to carrier 204 in mount shunt device to carrier operation 104. For purposes of simplicity, the shunt device is not illustrated in the following figures but is mounted and electrically connected in a manner similar to that set forth above regarding FIGS. 2-8, the discussion of which is incorporated here.

From mount shunt device to carrier operation 104 (or optionally from mount LED structure to carrier operation 102 in the event that mount shunt device to carrier operation 104 is not performed), flow moves to a mount red LED(s) operation 1606. In mount red LED(s) operation 1606, one or more red LEDs 1702 are mounted to carrier 204.

In accordance with this embodiment, two red LEDs 1702 are mounted. Although two red LEDs 1702 are illustrated in the figures and discussed below, in another embodiment, only a single red LED 1702 is mounted. In yet another embodiment, three or more red LEDs 1702 are mounted. Generally, at least one red LED 1702 is mounted.

In accordance with this embodiment, red LEDs 1702 include light emitting surfaces 1704. Red LEDs 1702 further include inactive surfaces 1706, and sides 1708 extending between light emitting surfaces 1704 and inactive surfaces 1706. Red LEDs 1702 further include bond pads 1710 on inactive surfaces 1706. As bond pads 1710 are on inactive surfaces 1706 and opposite light emitting surfaces 1704, red LEDs 1702 are sometimes called flip chip LEDs.

Returning again to mount red LED(s) operation 1606, inactive surfaces 1706 including bond pads 1710 are mounted to upper surface 204U of carrier 204, e.g., with an adhesive. In one embodiment, upper surface 204U of carrier 204 is adhesive thus avoiding application of a separate adhesive to mount inactive surfaces 1706 to upper surface 204U of carrier 204.

From mount red LED(s) operation 1606, flow moves to an overmold operation 1607. In overmold operation 1607, LED structure 202 and red LEDs 1702 are overmolded in a package body 1722.

Package body 1722 is a dielectric material, e.g., is molding compound, cured liquid encapsulant, or other dielectric material. Package body 1722 completely encloses LED structure 202 and red LEDs 1702.

More particularly, package body 1722 includes an upper, e.g., first, surface 1722U and a lower, e.g., second, surface 1722L. Upper surface 1722U is spaced apart from and above upper surface 206U of LED substrate 206 and light emitting surfaces 1704 of red LEDs 1702 such that package body 1722 exists between upper surface 1722U and surfaces 206U, 1704. Package body 1722 directly contacts and encloses upper surface 206U and sides 206S of LED substrate 206, sides 216 of LED 208, and light emitting surfaces 1704 and sides 1708 of red LEDs 1702.

Further, lower surface 1722L of package body 1722 directly contacts and encloses the exposed portions of upper surface 204U of carrier 204. Generally, lower surface 1722L of package body 1722 is parallel to and coplanar with inactive surface 212 of LED 208 and inactive surfaces 1706 of red LEDs 1702.

In one embodiment, a plurality of LED structures 202 and red LEDs 1702 are attached to carrier 204 during the fabrication of a plurality of LED packages 1700 simultaneously. The plurality of LED structures 202 and red LEDs 1702 are enclosed within package body 1722 and reconstituted into a larger format wafer, sometimes called a reconstituted wafer. Thus, although the fabrication of a single LED package 1700 is described herein, in light of this disclosure, those of skill in the art will understand that a plurality of LED packages 1700 are simultaneously fabricated in other embodiments.

Figure 18:
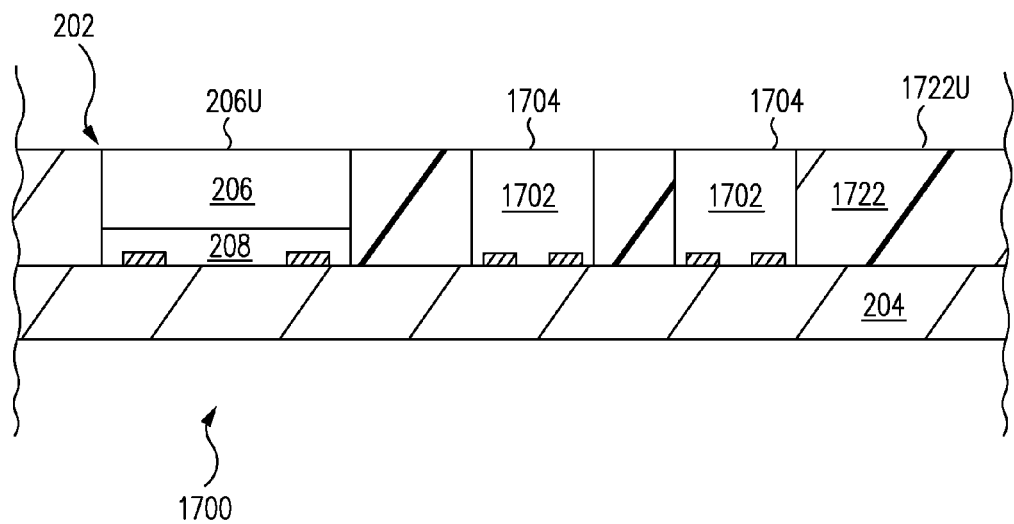
FIGS. 18, 19, 20, 21 are cross-sectional views of the LED package of FIG. 17 at further stages during fabrication in accordance with various embodiments.

FIG. 18 is a cross-sectional view of LED package 1700 of FIG. 17 at a further stage during fabrication in accordance with one embodiment. Referring now to FIGS. 16 and 18 together, from overmold operation 1607, flow moves to backgrind to expose LED substrate operation 108. In backgrind to expose LED substrate operation 108, package body 1722 is backgrinded to expose LED substrate 206 and red LEDs 1702.

More particularly, package body 1722 is backgrinded, e.g., removed, from upper surface 1722U. Generally, package body 1722 is thinned to expose upper surface 206U of LED substrate 206 and light emitting surfaces 1704 of red LEDs 1702.

After performance of backgrind to expose LED substrate operation 108, upper surface 206U of LED substrate 206 and light emitting surfaces 1704 of red LEDs 1702 are parallel to and coplanar with upper surface 1722U of package body 1722 as illustrated in FIG. 18. Accordingly, upper surface 206U of LED substrate 206 and light emitting surfaces 1704 of red LEDs 1702 are exposed from package body 1722.

In one embodiment, portions of upper surface 206U of LED substrate 206 and/or of light emitting surfaces 1704 of red LEDs 1702 are also removed during backgrind to expose LED substrate operation 108. For example, LED structure 202 and red LEDs 1702 do not have exactly the same thickness and thus extend upwards from carrier 204 to different heights. However, portions of upper surface 206U of LED substrate 206 and/or of light emitting surfaces 1704 of red LEDs 1702 are backgrinded, e.g., removed, to make upper surface 206U of LED substrate 206 and light emitting surfaces 1704 of red LEDs 1702 parallel and coplanar.

Figure 19:
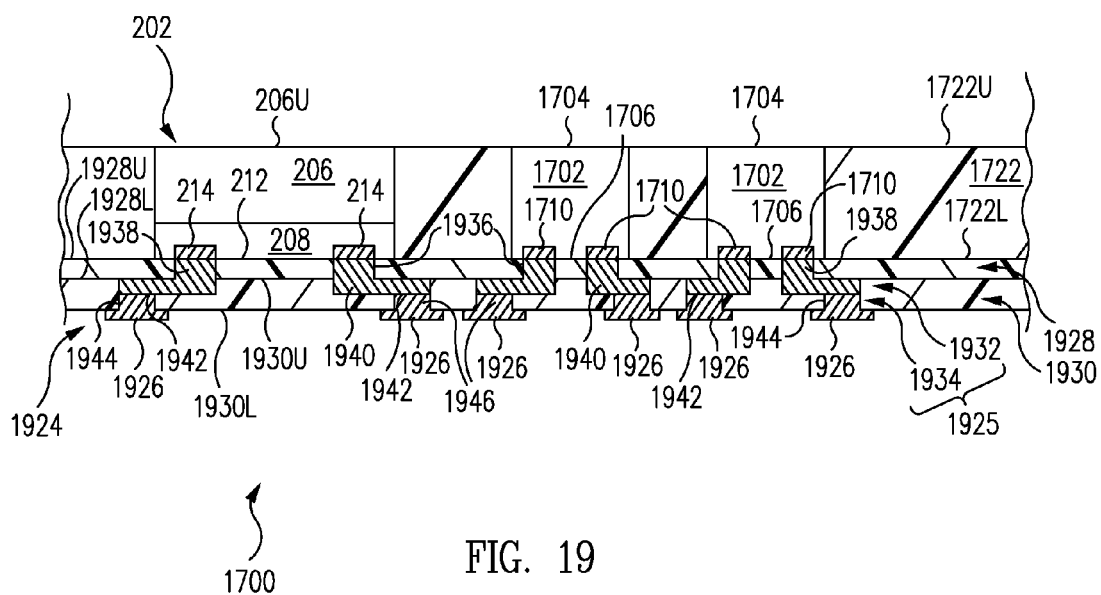

FIG. 19 is a cross-sectional view of LED package 1700 of FIG. 18 at a further stage during fabrication in accordance with one embodiment. Referring now to FIGS. 16, 18, and 19 together, from backgrind to expose LED substrate operation 108, flow moves to remove carrier operation 110. In remove carrier operation 110, carrier 204 is removed.

Removal of carrier 204 exposes inactive surface 212 including bond pads 214 of LED 208, inactive surfaces 1706 including bond pads 1710 of red LEDs 1702, and lower surface 1722L of package body 1722.

From remove carrier operation 110, flow moves to a form redistribution layer (RDL) buildup structure operation 1612. In form RDL buildup structure operation 1612, a RDL buildup structure 1924 is formed.

RDL buildup structure 1924 includes a RDL circuit pattern 1925 that redistributes the pattern of bond pads 214, 1710 to a pattern of RDL terminals 1926. In accordance with this embodiment, RDL buildup structure 1924 includes a first buildup dielectric layer 1928, a second buildup dielectric layer 1930, a first buildup circuit pattern 1932, and a second buildup circuit pattern 1934. First buildup circuit pattern 1932 and second buildup circuit pattern 1934 form RDL circuit pattern 1925 in this embodiment.

First buildup dielectric layer 1928 includes an upper, e.g., first, surface 1928U and an opposite lower, e.g., second, surface 1928L. Upper surface 1928U is attached to inactive surface 212 including bond pads 214 of LED 208, inactive surfaces 1706 including bond pads 1710 of red LEDs 1702, and lower surface 1722L of package body 1722 as illustrated in FIG. 19.

Via apertures 1936 are formed through first buildup dielectric layer 1928 and extend between lower surface 1928L and upper surface 1928U. Via aperture 1936 expose bond pads 214 of LED 208 and bond pads 1710 of red LEDs 1702.

First buildup circuit pattern 1932 is formed on or embedded within first buildup dielectric layer 1928. First buildup circuit pattern 1932 includes electrically conductive vias 1938 electrically connected to bond pads 214 of LED 208 and bond pads 1710 of red LEDs 1702 through via apertures 1936.

First buildup circuit pattern 1932 further includes electrically conductive traces 1940 on or embedded within lower surface 1928L of first buildup dielectric layer 1928. Traces 1940 are electrically connected to vias 1938 and include terminals 1942.

Second buildup dielectric layer 1930 also includes an upper, e.g., first, surface 1930U and an opposite lower, e.g., second, surface 1930L. Upper surface 1930U is attached to lower surface 1928L of first buildup dielectric layer 1928 and covers first buildup circuit pattern 1932 as illustrated in FIG. 19.

Via apertures 1944 are formed through second buildup dielectric layer 1930 and extend between lower surface 1930L and upper surface 1930U. Via apertures 1944 expose terminals 1942 of first buildup circuit pattern 1932.

Second buildup circuit pattern 1934 is formed on or embedded within second buildup dielectric layer 1930. Second buildup circuit pattern 1934 includes electrically conductive vias 1946 electrically connected to terminals 1942 of first buildup circuit pattern 1932 through via apertures 1944.

Second buildup circuit pattern 1934 further includes electrically conductive RDL terminals 1926 on lower surface 1930L of second buildup dielectric layer 1930. RDL terminals 1926 are electrically connected to vias 1946, e.g., are formed directly thereon or are connected thereto by traces (not shown) of second buildup circuit pattern 1934.

Accordingly, bond pads 214 of LED 208 and bond pads 1710 of red LEDs 1702 are electrically connected to RDL terminals 1926 by RDL circuit pattern 1925 as set forth above. RDL terminals 1926, sometimes called a package I/O array, are electrically connected to a larger substrate, e.g., a printed circuit mother board, sometimes called a second level assembly.

Although a particular RDL buildup structure 1924 is illustrated in FIG. 19 and discussed above, in light of this disclosure, those of skill in the art will understand that any one of a number of RDL buildup structures can be formed depending upon the particular input/output structure and routing desired.

Figure 20:
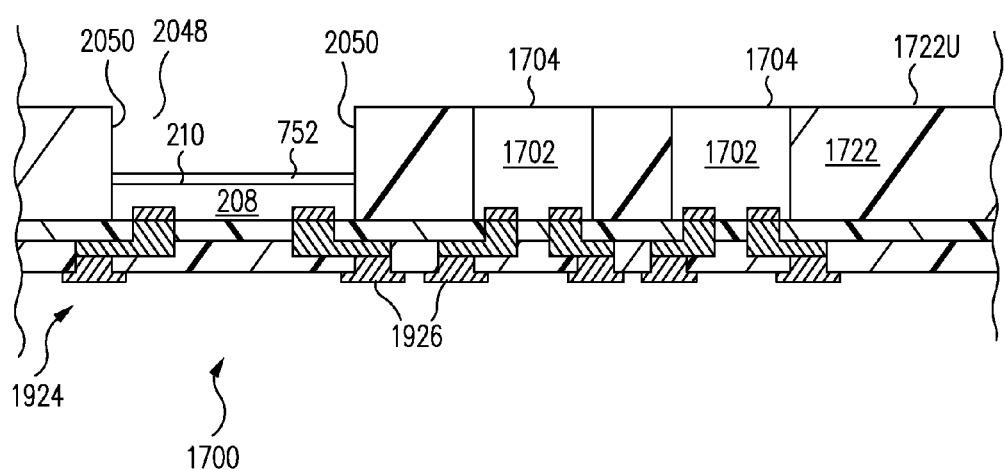

FIG. 20 is a cross-sectional view of LED package 1700 of FIG. 19 at a further stage during fabrication in accordance with one embodiment. Referring now to FIGS. 16, 19 and 20 together, from form RDL buildup structure operation 1612, flow moves to remove LED substrate operation 114. In remove LED substrate operation 114, LED substrate 206 as illustrated in FIG. 19 is removed as illustrated in FIG. 20.

Removal of LED substrate 206 creates a LED cavity 2048 in package body 1722 and directly exposes light emitting surface 210 of LED 208. More particularly, LED cavity 2048 is defined by LED cavity sidewalls 2050 of package body 1722 and light emitting surface 210 of LED 208. LED cavity sidewalls 2050 extend between upper surface 1722U of package body 1722 and light emitting surface 210 of LED 208.

From remove LED substrate operation 114, optionally, flow moves to coat LED operation 116. In coat LED operation 116, light emitting surface 210 of LED 208 is coated with LED coating 752. As illustrated in FIG. 20, LED coating 752 is applied directly to light emitting surface 210 of LED 208 and partially fills LED cavity 2048.

Figure 21:
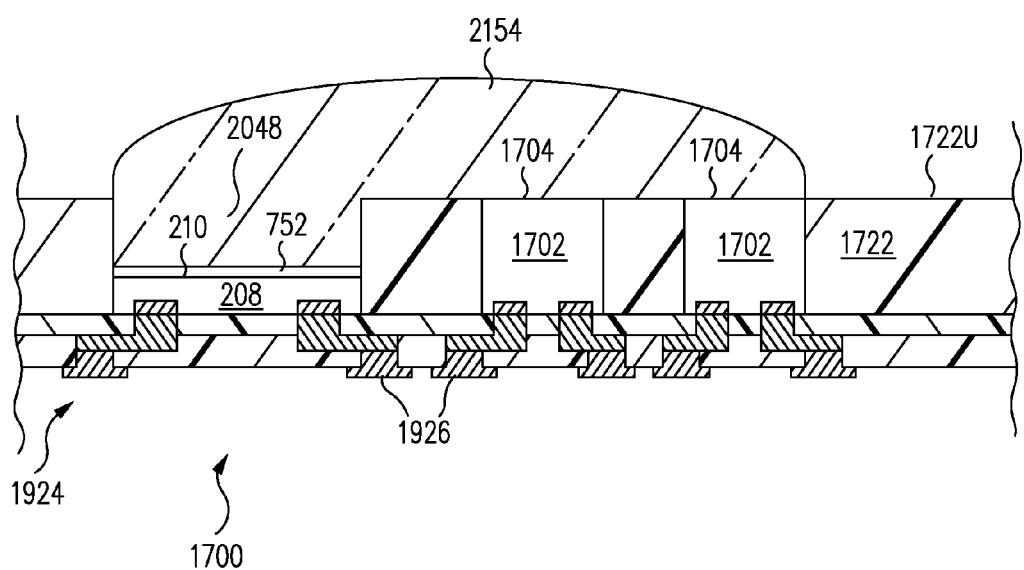

FIG. 21 is a cross-sectional view of LED package 1700 of FIG. 20 at a further stage during fabrication in accordance with one embodiment. Referring now to FIGS. 16 and 21 together, from coat LED operation 116 (or from remove LED substrate operation 114 in the event that coat LED operation 116 is not performed), flow moves to a form lens operation 1618. In form lens operation 1618, a lens 2154 is formed, e.g., molded in place or attached as a secondary piece part.

As illustrated in FIG. 21, lens 2154 is formed directly above light emitting surface 210 of LED 208 and light emitting surfaces 1704 of red LEDs 1702. In one embodiment, lens 2154 is transparent to the light emitted from LED 208 and red LEDs 1702. In accordance with this embodiment, lens 2154 is formed directly on LED coating 752 and fills LED cavity 2048. Lens 2154 further extends over and encapsulates red LEDs 1702.

In one embodiment, lens 2154 is an optical element which converges or diverges light from LED 208 and red LEDs 1702. In one particular embodiment, lens 2154 mixes light from LED 208, e.g., white light, with light from red LEDs 1702, e.g., red light, to provide a white light that is perceived as warmer white light than the white light emitted from LED 208 alone.

In one embodiment where a plurality of LED packages 1700 are formed simultaneously, after form lens operation 1618, the reconstituted wafer is singulated, e.g., by cutting with a saw, laser, or other singulation technique, to singulate the LED packages 1700 from one another. By reconstituting to a large format wafer, the cost of fabricating LED packages 1700 is minimized while at the same time scalability to large volumes is achieved.

As set forth above, LED package 1700 is formed using a WLFO process to form LED package 1700 without a substrate in one embodiment. By forming LED package 1700 without a substrate, the thickness of LED package 1700 is minimized. Further, by forming LED package 1700 without a substrate, heat removal from LED 208 and red LEDs 1702 is maximized as is electrical performance. Further still, by forming LED package 1700 without a substrate, the fabrication cost of LED package 1700 is minimized.

Figure 22:
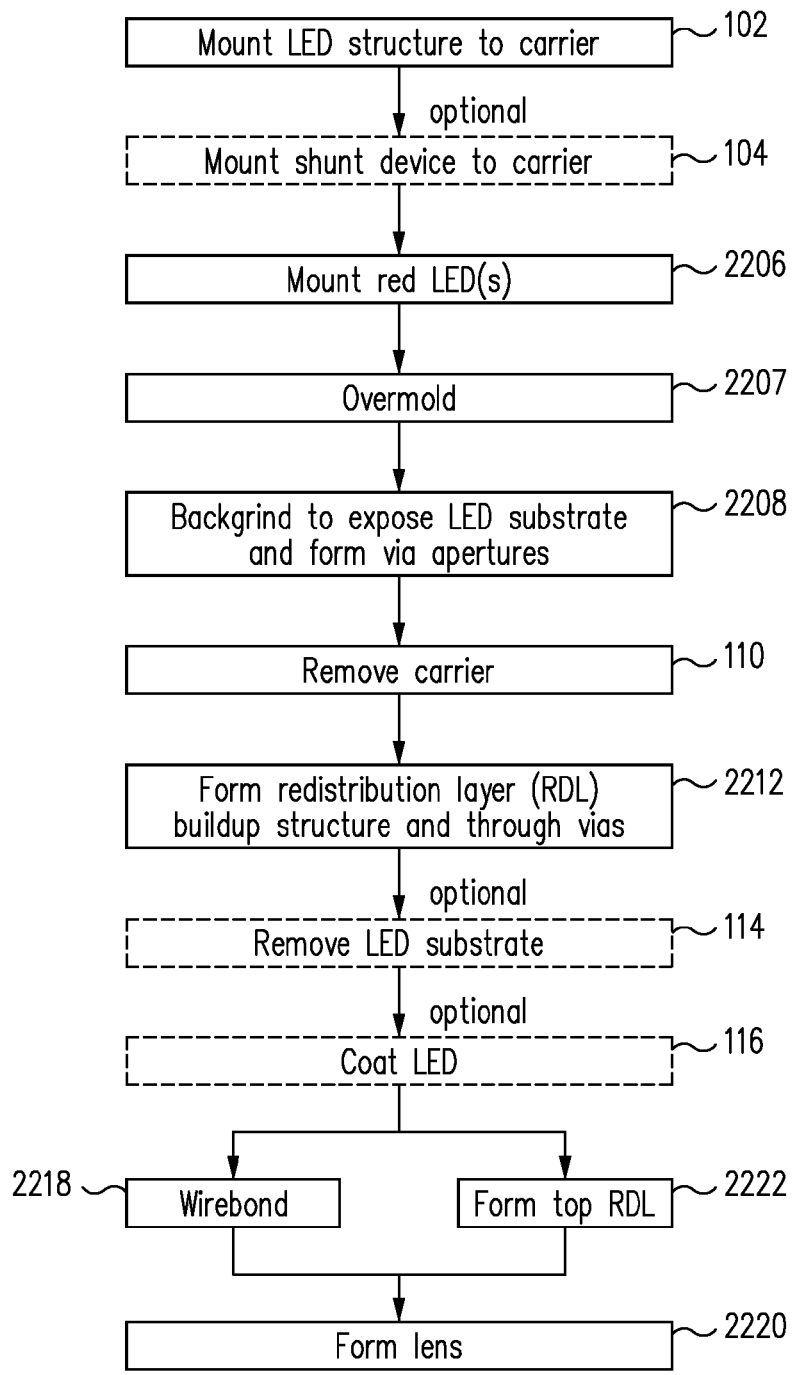
FIG. 22 is a flow diagram of a multiple LED package formation method in accordance with other embodiments.

FIG. 22 is a flow diagram of a multiple LED package formation method 2200 in accordance with other embodiments. Mount LED structure to carrier operation 102, mount shunt device to carrier operation 104, remove carrier operation 110, remove LED substrate operation 114, and coat LED operation 116 of multiple LED package formation method 2200 of FIG. 22 are similar or identical to mount LED structure to carrier operation 102, mount shunt device to carrier operation 104, remove carrier operation 110, remove LED substrate operation 114, and coat LED operation 116 of single LED package formation method 100 of FIG. 1, respectively, and so are only briefly described below.

Figure 23:
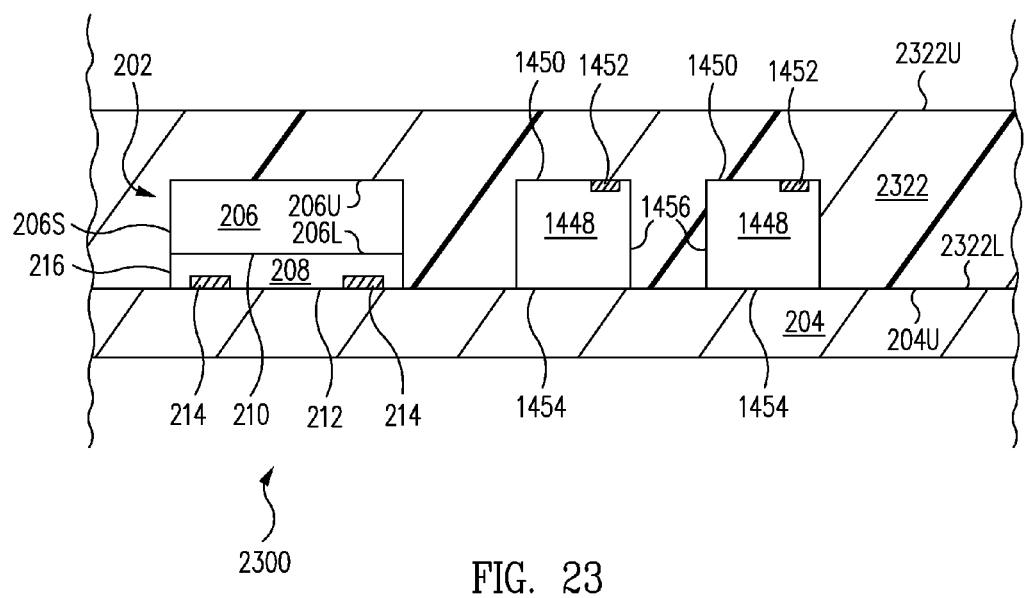
FIG. 23 is a cross-sectional view of a LED package during fabrication in accordance with one embodiment.

FIG. 23 is a cross-sectional view of a LED package 2300 during fabrication in accordance with one embodiment. Referring now to FIGS. 22 and 23 together, LED structure 202 is mounted to carrier 204 in mount LED structure to carrier operation 102. A shunt device (similar to shunt device 218 of FIGS. 2-8) is mounted to carrier 204 in mount shunt device to carrier operation 104. For purposes of simplicity, the shunt device is not illustrated in the following figures but is mounted and electrically connected in a manner similar to that set forth above regarding FIGS. 2-8, the discussion of which is incorporated here.

From mount shunt device to carrier operation 104 (or optionally from mount LED structure to carrier operation 102 in the event that mount shunt device to carrier operation 104 is not performed), flow moves to a mount red LED(s) operation 2206. In mount red LED(s) operation 2206, one or more red LEDs 1448 are mounted to carrier 204.

In accordance with this embodiment, two red LEDs 1448 are mounted. Although two red LEDs 1448 are illustrated in the figures and discussed below, in another embodiment, only a single red LED 1448 is mounted. In yet another embodiment, three or more red LEDs 1448 are mounted. Generally, at least one red LED 1448 is mounted.

In accordance with this embodiment, red LEDs 1448 include light emitting surfaces 1450 having bond pads 1452 formed thereon. Red LEDs 1448 further include inactive surfaces 1454, and sides 1456 extending between light emitting surfaces 1450 and inactive surfaces 1454.

In mount red LED(s) operation 2206, inactive surfaces 1454 are mounted to upper surface 204U of carrier 204, e.g., with an adhesive. In one embodiment, upper surface 204U of carrier 204 is adhesive thus avoiding application of a separate adhesive to mount inactive surfaces 1454 to upper surface 204U of carrier 204.

From mount red LED(s) operation 2206, flow moves to an overmold operation 2207. In overmold operation 2207, LED structure 202 and red LEDs 1448 are overmolded in a package body 2322.

Package body 2322 is a dielectric material, e.g., is molding compound, cured liquid encapsulant, or other dielectric material. Package body 2322 completely encloses LED structure 202 and red LEDs 1448.

More particularly, package body 2322 includes an upper, e.g., first, surface 2322U and a lower, e.g., second, surface 2322L. Upper surface 2322U is spaced apart from and above upper surface 206U of LED substrate 206 and light emitting surfaces 1450 of red LEDs 1448 such that package body 2322 exists between upper surface 2322U and surfaces 206U, 1450. Package body 2322 directly contacts and encloses upper surface 206U and sides 206S of LED substrate 206, sides 216 of LED 208, and light emitting surfaces 1450 and sides 1456 of red LEDs 1448.

Further, lower surface 2322L of package body 2322 directly contacts and encloses the exposed portions of upper surface 204U of carrier 204. Generally, lower surface 2322L of package body 2322 is parallel to and coplanar with inactive surface 212 of LED 208 and inactive surfaces 1454 of red LEDs 1448.

In one embodiment, a plurality of LED structures 202 and red LEDs 1448 are attached to carrier 204 during the fabrication of a plurality of LED packages 2300 simultaneously. The plurality of LED structures 202 and red LEDs 1448 are enclosed within package body 2322 and reconstituted into a larger format wafer, sometimes called a reconstituted wafer. Thus, although the fabrication of a single LED package 2300 is described herein, in light of this disclosure, those of skill in the art will understand that a plurality of LED packages 2300 are simultaneously fabricated in other embodiments.

Figure 24:
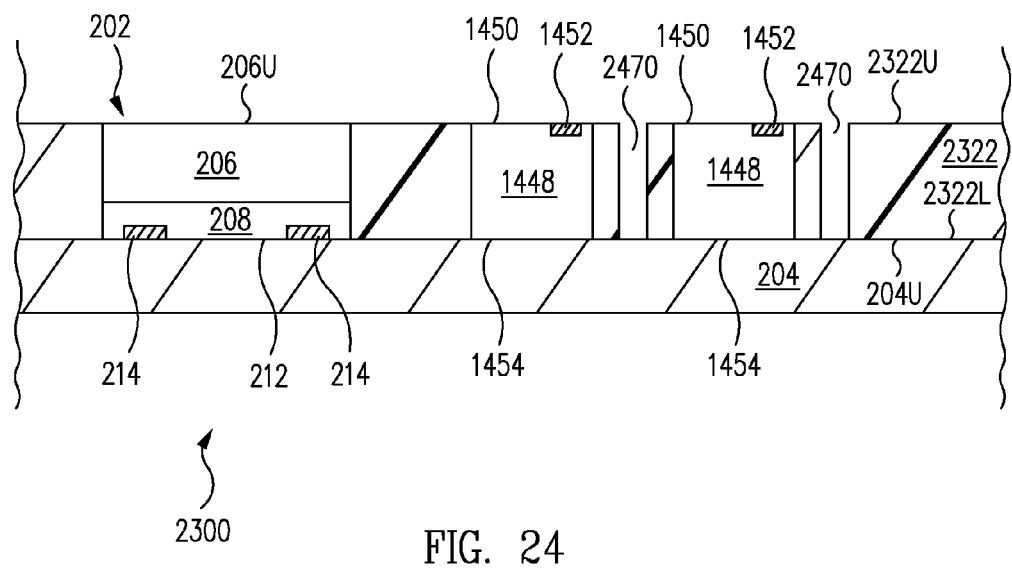
FIGS. 24, 25, 26, 27 are cross-sectional views of the LED package of FIG. 23 at further stages during fabrication in accordance with various embodiments.

FIG. 24 is a cross-sectional view of LED package 2300 of FIG. 23 at a further stage during fabrication in accordance with one embodiment. Referring now to FIGS. 22 and 24 together, from overmold operation 2207, flow moves to a backgrind to expose LED substrate and form via apertures operation 2208. In backgrind to expose LED substrate and form via apertures operation 2208, package body 2322 is backgrinded to expose LED substrate 206 and red LEDs 1448.

More particularly, package body 2322 is backgrinded, e.g., removed, from upper surface 2322U. Generally, package body 2322 is thinned to expose upper surface 206U of LED substrate 206 and light emitting surfaces 1450 of red LEDs 1448.

After performance of backgrind to expose LED substrate and form via apertures operation 2208, upper surface 206U of LED substrate 206 and light emitting surfaces 1450 of red LEDs 1448 are parallel to and coplanar with upper surface 2322U of package body 2322 as illustrated in FIG. 24. Accordingly, upper surface 206U of LED substrate 206 and light emitting surfaces 1450 of red LEDs 1448 are exposed from package body 2322.

In one embodiment, portions of upper surface 206U of LED substrate 206 and/or of light emitting surfaces 1450 of red LEDs 1448 are also removed during backgrind to expose LED substrate and form via apertures operation 2208. For example, LED structure 202 and red LEDs 1448 do not have exactly the same thickness and thus extend upwards from carrier 204 to different heights. However, portions of upper surface 206U of LED substrate 206 and/or of light emitting surfaces 1450 of red LEDs 1448 are backgrinded, e.g., removed, to make upper surface 206U of LED substrate 206 and light emitting surfaces 1450 of red LEDs 1448 parallel and coplanar.

Further, through via apertures 2470 are formed in package body 2322 in backgrind to expose LED substrate and form via apertures operation 2208. Through via apertures 2470 extend entirely through package body 2322 to carrier 204. More particularly, through via apertures 2470 extend from upper surface 2322U to lower surface 2322L of package body 2322. In one embodiment, one or more through via apertures 2470 are formed, e.g., using laser ablation or during molding of package body 2322, adjacent each of the red LEDS 1448.

Figure 25:
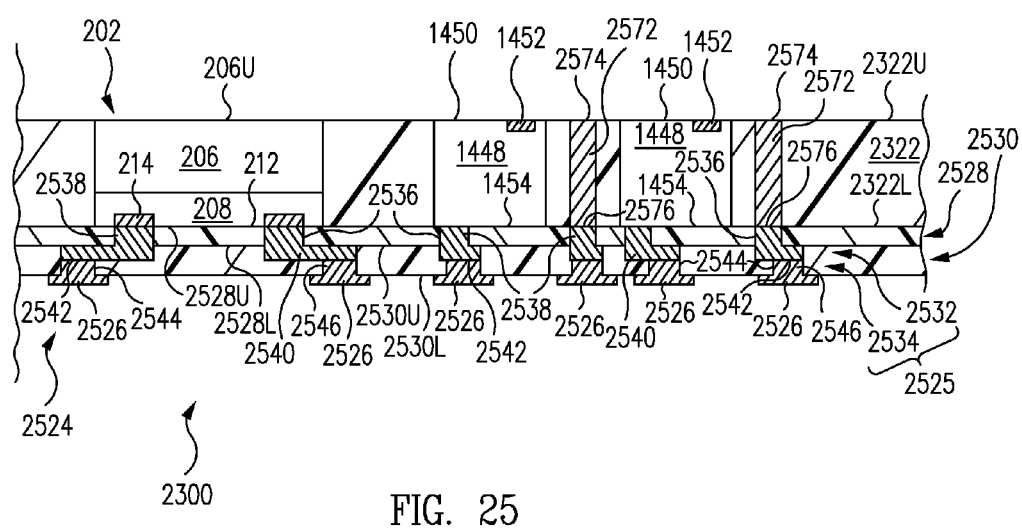

FIG. 25 is a cross-sectional view of LED package 2300 of FIG. 24 at a further stage during fabrication in accordance with one embodiment. Referring now to FIGS. 22, 24, and 25 together, from backgrind to expose LED substrate and form via apertures operation 2208, flow moves to remove carrier operation 110. In remove carrier operation 110, carrier 204 is removed.

Removal of carrier 204 exposes inactive surface 212 including bond pads 214 of LED 208, inactive surfaces 1454 of red LEDs 1448, and lower surface 2322L of package body 2322. Further, removal of carrier 204 uncovers through via apertures 2470 at lower surface 2322L of package body 2322.

From remove carrier operation 110, flow moves to a form redistribution layer (RDL) buildup structure and through vias operation 2212. In form RDL buildup structure and through vias operation 2212, through vias 2572 and a RDL buildup structure 2524 are formed.

More particularly, through via apertures 2470 in package body 2322 are filled with an electrically conductive material to form through vias 2572 within through via apertures 2470.

Through vias 2572 extend entirely through package body 2322 and between upper surface 2322U and lower surface 2322L.

The ends of through vias 2572 at upper surface 2322U of package body 2322 form upper, e.g., first, through via terminals 2574 of through vias 2572. Similarly, the ends of through vias 2572 at lower surface 2322L of package body 2322 form lower, e.g., second, through via terminals 2576 of through vias 2572.

RDL buildup structure 2524 includes a RDL circuit pattern 2525 that redistributes the pattern of bond pads 214, inactive surfaces 1454 of red LEDs 1448, and lower through via terminals 2576 of through vias 2572 to a pattern of RDL terminals 2526. In accordance with this embodiment, RDL buildup structure 2524 includes a first buildup dielectric layer 2528, a second buildup dielectric layer 2530, a first buildup circuit pattern 2532, and a second buildup circuit pattern 2534. First buildup circuit pattern 2532 and second buildup circuit pattern 2534 form RDL circuit pattern 2525 in this embodiment.

First buildup dielectric layer 2528 includes an upper, e.g., first, surface 2528U and an opposite lower, e.g., second, surface 2528L. Upper surface 2528U is attached to inactive surface 212 of LED 208, lower surface 2322L of package body 2322, and lower through via terminals 2576 of through vias 2572 as illustrated in FIG. 25.

Via apertures 2536 are formed through first buildup dielectric layer 2528 and extend between lower surface 2528L and upper surface 2528U. Via aperture 2536 expose bond pads 214 of LED 208. Further, via apertures 2536 expose portions, or all, of inactive surfaces 1454 of red LEDs 1448. Further, via apertures 2536 expose lower through via terminals 2576 of through vias 2572.

First buildup circuit pattern 2532 is formed on or embedded within first buildup dielectric layer 2528. First buildup circuit pattern 2532 includes electrically conductive vias 2538 electrically connected to bond pads 214 of LED 208, inactive surfaces 1454 of red LEDS 1448, and lower through via terminals 2576 of through vias 2572.

First buildup circuit pattern 2532 further includes electrically conductive traces 2540 on or embedded within lower surface 2528L of first buildup dielectric layer 2528. Traces 2540 are electrically connected to vias 2538 and include terminals 2542.

Second buildup dielectric layer 2530 also includes an upper, e.g., first, surface 2530U and an opposite lower, e.g., second, surface 2530L. Upper surface 2530U is attached to lower surface 2528L of first buildup dielectric layer 2528 and covers first buildup circuit pattern 2532 as illustrated in FIG. 25.

Via apertures 2544 are formed through second buildup dielectric layer 2530 and extend between lower surface 2530L and upper surface 2530U. Via apertures 2544 expose terminals 2542 of first buildup circuit pattern 2532.

Second buildup circuit pattern 2534 is formed on or embedded within second buildup dielectric layer 2530. Second buildup circuit pattern 2534 includes electrically conductive vias 2546 electrically connected to terminals 2542 of first buildup circuit pattern 2532 through via apertures 2544.

Second buildup circuit pattern 2534 further includes electrically conductive RDL terminals 2526 on lower surface 2530L of second buildup dielectric layer 2530. RDL terminals 2526 are electrically connected to vias 2546, e.g., are formed directly thereon or are connected thereto by traces (not shown) of second buildup circuit pattern 2534.

Accordingly, bond pads 214 of LED 208, inactive surfaces 1454 of red LEDs 1448, and lower through via terminals 2576 of through vias 2572 are electrically connected to RDL terminals 2526 by RDL circuit pattern 2525 as set forth above. RDL terminals 2526, sometimes called a package I/O array, are electrically connected to a larger substrate, e.g., a printed circuit mother board, sometimes called a second level assembly.

Although a particular RDL buildup structure 2524 is illustrated in FIG. 25 and discussed above, in light of this disclosure, those of skill in the art will understand that any one of a number of RDL buildup structures can be formed depending upon the particular input/output structure and routing desired.

Further, although vias 2572 are described above as being formed before RDL buildup structure 2524, in other embodiments, through vias 2572 are formed after or simultaneously with RDL buildup structure 2524.

Figure 26:
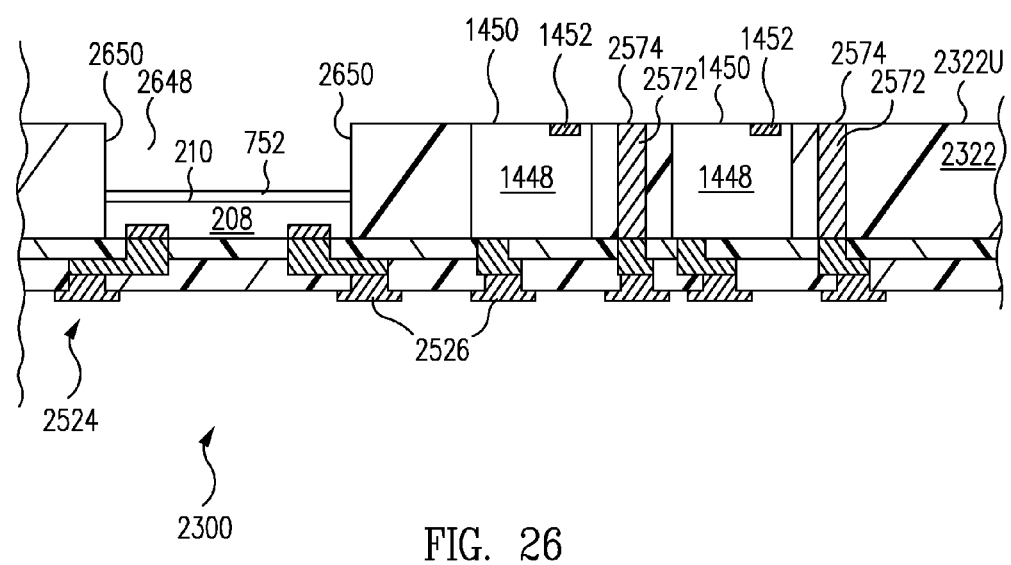

FIG. 26 is a cross-sectional view of LED package 2300 of FIG. 25 at a further stage during fabrication in accordance with one embodiment. Referring now to FIGS. 22, 25 and 26 together, from form RDL buildup structure and through vias operation 2212, flow moves to remove LED substrate operation 114. In remove LED substrate operation 114, LED substrate 206 as illustrated in FIG. 25 is removed as illustrated in FIG. 26.

Removal of LED substrate 206 creates a LED cavity 2648 in package body 2322 and directly exposes light emitting surface 210 of LED 208. More particularly, LED cavity 2648 is defined by LED cavity sidewalls 2650 of package body 2322 and light emitting surface 210 of LED 208. LED cavity sidewalls 2650 extend between upper surface 2322U of package body 2322 and light emitting surface 210 of LED 208.

From remove LED substrate operation 114, optionally, flow moves to coat LED operation 116. In coat LED operation 116, light emitting surface 210 of LED 208 is coated with LED coating 752. As illustrated in FIG. 26, LED coating 752 is applied directly to light emitting surface 210 of LED 208 and partially fills LED cavity 2648.

Figure 27:
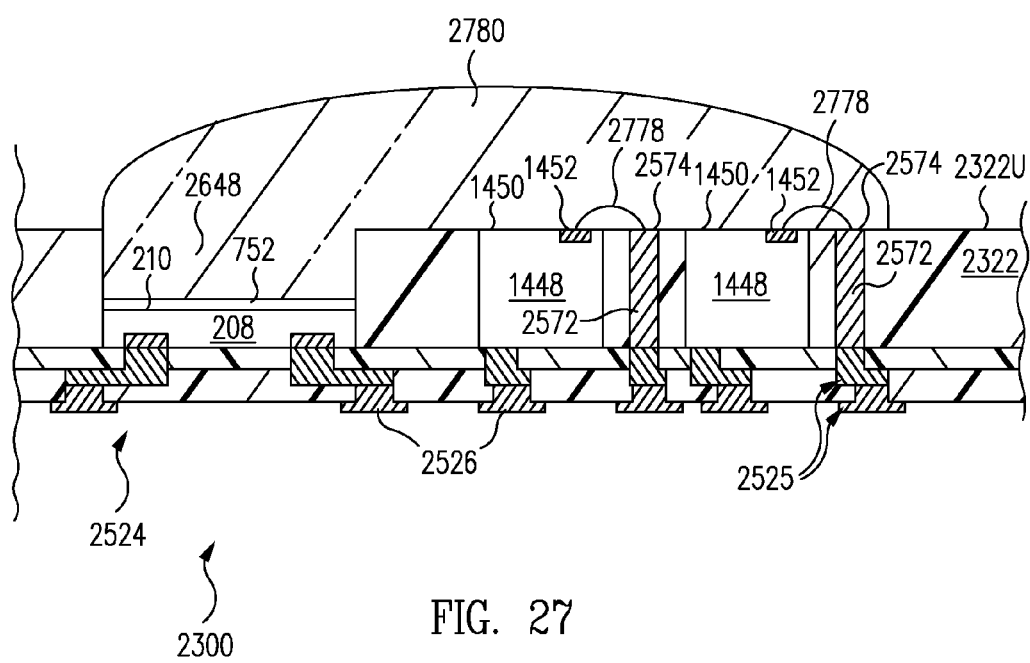

FIG. 27 is a cross-sectional view of LED package 2300 of FIG. 26 at a further stage during fabrication in accordance with one embodiment. Referring now to FIGS. 22 and 27 together, from coat LED operation 116 (or from remove LED substrate operation 114 in the event that coat LED operation 116 is not performed), flow moves to a wirebond operation 2218. In wirebond operation 2218, bond pads 1452 of red LEDs 1448 are electrically connected to upper through via terminals 2574 of through vias 2572 by electrically conductive bond wires 2778. Accordingly, bond pads 1452 of red LEDs 1448 are electrically connected to bond wires 2778, through vias 2572, RDL circuit pattern 2525, and to RDL terminals 2526.

From wirebond operation 2218, flow moves to a form lens operation 2220. In form lens operation 2220, a lens 2780 is formed, e.g., molded in place or attached as a secondary piece part.

As illustrated in FIG. 27, lens 2780 is formed directly above light emitting surface 210 of LED 208 and light emitting surfaces 1450 of red LEDs 1448. In one embodiment, lens 2780 is transparent to the light emitted from LED 208 and red LEDs 1448. In accordance with this embodiment, lens 2780 is formed directly on LED coating 752 and fills LED cavity 2648. Lens 2780 further extends over and encapsulates red LEDs 1448 including bond wires 2778 and upper through via terminals 2574 of through vias 2572.

In one embodiment, lens 2780 is an optical element which converges or diverges light from LED 208 and red LEDs 1448. In one particular embodiment, lens 2780 mixes light from LED 208, e.g., white light, with light from red LEDs 1448, e.g., red light, to provide a white light that is perceived as warmer white light than the white light emitted from LED 208 alone.

In one embodiment where a plurality of LED packages 2300 are formed simultaneously, after form lens operation 2220, the reconstituted wafer is singulated, e.g., by cutting with a saw, laser, or other singulation technique, to singulate the LED packages 2300 from one another. By reconstituting to a large format wafer, the cost of fabricating LED packages 2300 is minimized while at the same time scalability to large volumes is achieved.

As set forth above, LED package 2300 is formed using a WLFO process to form LED package 2300 without a substrate in one embodiment. By forming LED package 2300 without a substrate, the thickness of LED package 2300 is minimized. Further, by forming LED package 2300 without a substrate, heat removal from LED 208 and red LEDs 1448 is maximized as is electrical performance. Further still, by forming LED package 2300 without a substrate, the fabrication cost of LED package 2300 is minimized.

Figure 28:
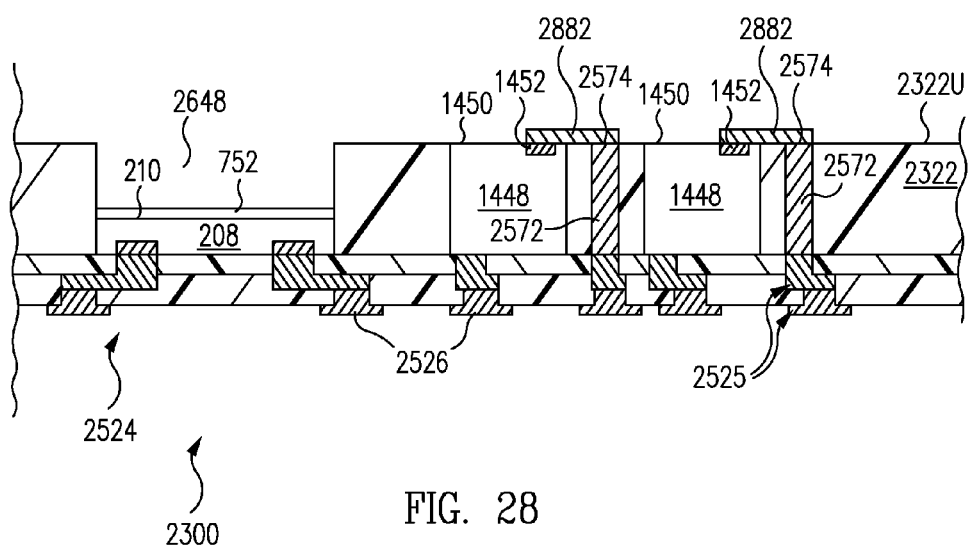
FIGS. 28, 29 are a cross-sectional view of the LED package of FIG. 26 at further stages during fabrication in accordance with another embodiment.

FIG. 28 is a cross-sectional view of LED package 2300 of FIG. 26 at a further stage during fabrication in accordance with another embodiment. Referring now to FIGS. 22 and 28 together, from coat LED operation 116 (or from remove LED substrate operation 114 in the event that coat LED operation 116 is not performed), flow moves to a form top RDL operation 2222. In form top RDL operation 2222, bond pads 1452 of red LEDs 1448 are electrically connected to upper through via terminals 2574 of through vias 2572 by electrically conductive top redistribution layer (RDL) traces 2882. Accordingly, bond pads 1452 of red LEDs 1448 are electrically connected to top RDL traces 2882, through vias 2572, RDL circuit pattern 2525, and to RDL terminals 2526.

In accordance with this embodiment, top RDL traces 2882 are formed directly on upper surface 2322U of package body 2322. Top RDL traces 2882 extend along upper surface 2322U of package body 2322 between bond pads 1452 of red LEDs 1448 and upper through via terminals 2574 of through vias 2572.

Figure 29:
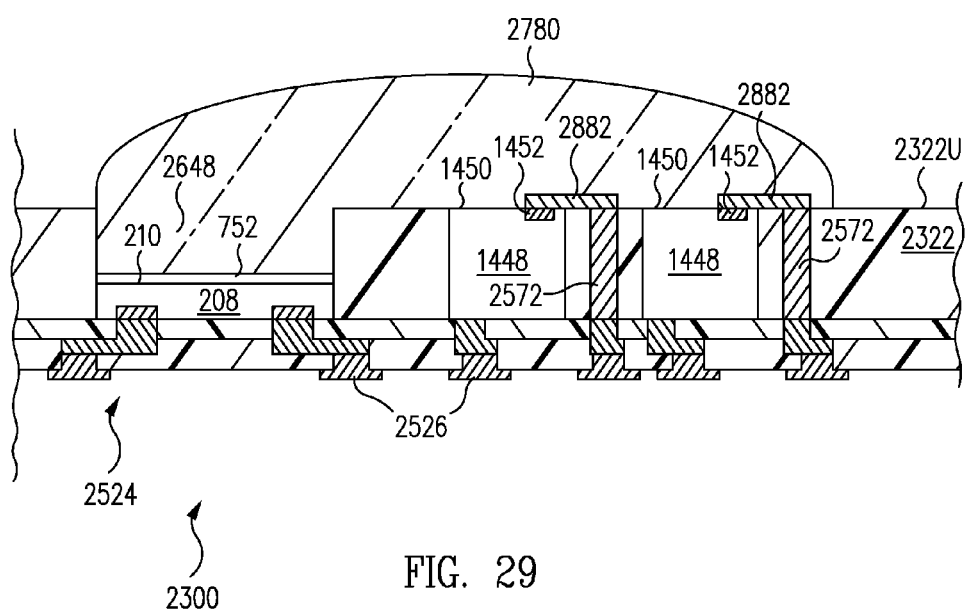

FIG. 29 is a cross-sectional view of LED package 2300 of FIG. 28 at a further stage during fabrication in accordance with one embodiment. Referring now to FIGS. 22 and 29 together, from form top RDL operation 2222, flow moves to form lens operation 2220, which is performed as discussed above. However, in accordance with this embodiment, lens 2780 extends over and encapsulates top RDL traces 2882.

Paying particular attention to FIG. 22, although remove LED substrate operation 114 and coat LED operation 116 are set forth as preceding wirebond operation 2218 and form top RDL operation 2222, in other embodiments, wirebond operation 2218 and/or form top RDL operation 2222 are performed prior to remove LED substrate operation 114 and coat LED operation 116.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A method comprising:
coupling a light emitting diode (LED) structure to a carrier;
overmolding the LED structure in a package body;
backgrinding the package body to expose the LED structure;
removing the carrier;
forming a redistribution layer (RDL) buildup structure comprising a RDL circuit pattern coupled to a LED of the LED structure; and
removing a LED substrate of the LED structure.

2. The method of claim 1 wherein the removing a LED substrate exposes a light emitting surface of the LED.

3. The method of claim 2 further comprising coating the light emitting surface with a LED coating.

4. The method of claim 2 further comprising forming a lens directly over the light emitting surface.

5. A method comprising:
coupling a light emitting diode (LED) structure to a carrier;
mounting a shunt device to the carrier;
overmolding the LED structure in a package body;
backgrinding the package body to expose the LED structure;
removing the carrier; and
forming a redistribution layer (RDL) buildup structure comprising a RDL circuit pattern coupled to a LED of the LED structure.

6. A method comprising:
coupling a light emitting diode (LED) structure to a carrier;
overmolding the LED structure in a package body;
forming a LED aperture in the package body;
backgrinding the package body to expose the LED structure;
removing the carrier;
forming a redistribution layer (RDL) buildup structure comprising a RDL circuit pattern coupled to a LED of the LED structure; and
mounting a supplemental LED to the RDL buildup structure and within the LED aperture.

7. The method of claim 6 wherein the RDL buildup structure comprises:
an inactive surface LED terminal coupled to an inactive surface of the supplemental LED; and
an active surface LED terminal coupled to a bond pad on a light emitting surface of the supplemental LED.

8. The method of claim 7 further comprising coupling the bond pad on the light emitting surface of the supplemental LED to the active surface LED terminal with a bond wire.

9. A method comprising:
coupling a light emitting diode (LED) structure to a carrier;
coupling a supplemental LED to the carrier;
overmolding the LED structure and the supplemental LED in a package body; and
backgrinding a first surface of the package body to cause the first surface to be parallel to and coplanar with a first surface of a LED substrate of the LED structure and a light emitting surface of the supplemental LED.

10. The method of claim 9 wherein the backgrinding exposes the first surface of the LED substrate and the light emitting surface of the supplemental LED.

11. The method of claim 9 further comprising:
removing the carrier; and
forming a redistribution layer (RDL) buildup structure comprising a RDL circuit pattern coupled to a LED of the LED structure and to the supplemental LED.

12. The method of claim 11 wherein the supplemental LED comprises bond pads on an inactive surface of the supplemental LED, the RDL circuit pattern being coupled to the bond pads.

13. The method of claim 9 further comprising removing the LED substrate of the LED structure.

14. The method of claim 9 further comprising forming an electrically conductive through via through the package body, the through via comprising a through via terminal at the first surface of the package body; and coupling a bond pad on the light emitting surface of the supplemental LED to the through via terminal.

15. The method of claim 14 wherein the coupling a bond pad comprises coupling the bond pad to the through via terminal with a bond wire.

16. The method of claim 14 wherein the coupling a bond pad comprises coupling the bond pad to the through via terminal with a RDL trace, the RDL trace extending on the first surface of the package body between the bond pad and the through via terminal.

17. A method comprising:

coupling a light emitting diode (LED) structure to a carrier;

coupling a supplemental LED to the carrier;

forming a package body comprising a first surface parallel to and coplanar with a first surface of a LED substrate of the LED structure and a light emitting surface of the supplemental LED; and forming a lens directly above a light emitting surface of the LED structure and the light emitting surface of the supplemental LED.

18. The method of claim 17 further comprising:

removing the carrier; and forming a redistribution layer (RDL) buildup structure comprising a RDL circuit pattern coupled to a LED of the LED structure and to the supplemental LED.

19. The method of claim 17 further comprising:

removing the LED substrate of the LED structure to expose the light emitting surface of the LED.

* * * * *